(12) United States Patent  (10) Patent No.: US 7,480,891 B2
Sezginer  (45) Date of Patent: Jan. 20, 2009

(54) METHOD AND APPARATUS OF MODEL-BASED PHOTOMASK SYNTHESIS

(75) Inventor: Abdurrahman Sezginer, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 501 days.

(21) Appl. No.: 11/203,505

(22) Filed: Aug. 13, 2005

(65) Prior Publication Data

US 2006/0248495 A1 Nov. 2, 2006

Related U.S. Application Data

(60) Provisional application No. 60/676,136, filed on Apr. 29, 2005.

(51) Int. Cl.
G06F 17/50 (2006.01)
(52) U.S. Cl. .......................................... 716/21; 716/19
(58) Field of Classification Search .................. 716/21, 716/32
See application file for complete search history.

(56) References Cited

U.S. PATENT DOCUMENTS

| | | | |
|---|---|---|---|
| 4,231,811 A | 11/1980 | Somekh et al. | |
| 4,902,899 A | 2/1990 | Lin et al. | |
| 5,242,770 A | 9/1993 | Chen et al. | |
| 5,680,588 A * | 10/1997 | Gortych et al. | 716/19 |
| 6,114,071 A | 9/2000 | Chen et al. | |
| 6,130,012 A | 10/2000 | May et al. | |
| 6,539,521 B1 * | 3/2003 | Pierrat et al. | 716/4 |
| 6,700,095 B2 | 3/2004 | Sandstrom et al. | |
| 2004/0209170 A1 | 10/2004 | Broeke et al. | |

OTHER PUBLICATIONS

W. Rudin, "Functional Analysis," Definition 10.34. Mc-Graw Hill, 1973.
N. Cobb, et al., "Mathematical and CAD Framework for Proximity Correction," (Proc. SPIE vol. 2726, pp. 208-222, 1996).
Gill, Murray and Wright, Practical Optimization, Elsevier, 1986.
G.H. Golub, et al., Matrix Computations, Sect. 5.2, John Hopkins University Press, Baltimore, 1966.
C. C. Paige, et al., ACM Trans. Math. Software, vol. 8, No. 2, Jun. 1982, p. 195-209.
T. Brist, et al., "Model-Assited Placement of Sub-Resolution Assist Features: Experimental Results," Proc. SPIE vol. 5042, p. 99-106, 2003.
Socha et al., "Contact hole reticle optimization by using interference mapping lithography (IML)" (Proc. SPIE vol. 5377, p. 222-240, Optical Microlithography XVII, May 2004).
Socha et al., "Contact hole reticle optimization by using interference mapping lithography (IML)" (Proc. SPIE vol. 5446, p. 516-534, Photomask and Next-Generation Lithography Mask Technology XI, Aug. 2004).

(Continued)

*Primary Examiner*—Jack Chiang
*Assistant Examiner*—Brandon W Bowers
(74) *Attorney, Agent, or Firm*—Sheppard Mullin Richter & Hampton LLP

(57) ABSTRACT

An apparatus and method for improving image quality in a photolithographic process includes calculating a figure-of-demerit for a photolithographic mask function and then adjusting said photolithographic mask function to reduce the figure of demerit.

55 Claims, 12 Drawing Sheets

OTHER PUBLICATIONS

Van Den Broeke et al., "Application of CPL with Interference Mapping Lithography to generate random contact reticle designs for the 65-nm node," (Proc. SPIE vol. 5446, p. 550-559, Photomask and Next-Generation Lithography Mask Technology XI, Aug. 2004).

Gill, Murray and Wright, Practical Optimization, Elsevier, Ch 4, pp. 98-141, 1986.

G.H. Golub, et al., Matrix Computations, Sect. 5.2, John Hopkins University Press, Baltimore, pp. 211-243, 1966.

C. C. Paige, et al., "Algorithm 583 LSQR: Sparse Linear Equations and Least Squares Problems," ACM Trans. Math. Software, vol. 8, No. 2, pp. 195-209,, Jun. 1982.

\* cited by examiner

METHOD AND APPARATUS OF MODEL-BASED PHOTOMASK SYNTHESIS

RELATED APPLICATIONS

This application is a continuation-in-part of U.S. patent application Ser. No. 60/676,136, entitled "Apparatus and Method for Optical Proximity Correction", filed Apr. 29, 2005, and is related to U.S. utility patent application Ser. No. 11/203,498, entitled "An Apparatus and Method for Segmenting Edges for Optical Proximity Correction", filed Aug. 13, 2005, and U.S. utility patent application Ser. No. 11/203,522, Entitled "Apparutus and Method for Breaking Up and Merging Polygons", filed Aug. 13, 2005, which related applications are incorporated herein by reference as though fully set forth and which applications are also continuation-in-part applications of U.S. patent application Ser. No. 60/676,136. Elements of the inventions disclosed in these thee patent applications can be used separately or in combination with each other.

BACKGROUND

In sub-wavelength optical lithography, the pattern on the photomask is different than a scaled version of the pattern required on the wafer. Many different methods and systems for optical proximity correction and inserting subresolution assist features into the photomask layout have been disclosed in the prior art. Nevertheless, there is a need for a new and improved apparatus and method for synthesizing photomasks for sub-wavelength lithography.

BRIEF SUMMARY OF THE INVENTION

An apparatus and method for improving image quality in a photolithographic process includes calculating a figure-of-demerit for a photolithographic mask function and then adjusting said photolithographic mask function to reduce the figure-of-demerit.

DETAILED DESCRIPTION OF THE PREFERRED EMBODIMENTS

An apparatus and method for model-based photomask synthesis is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
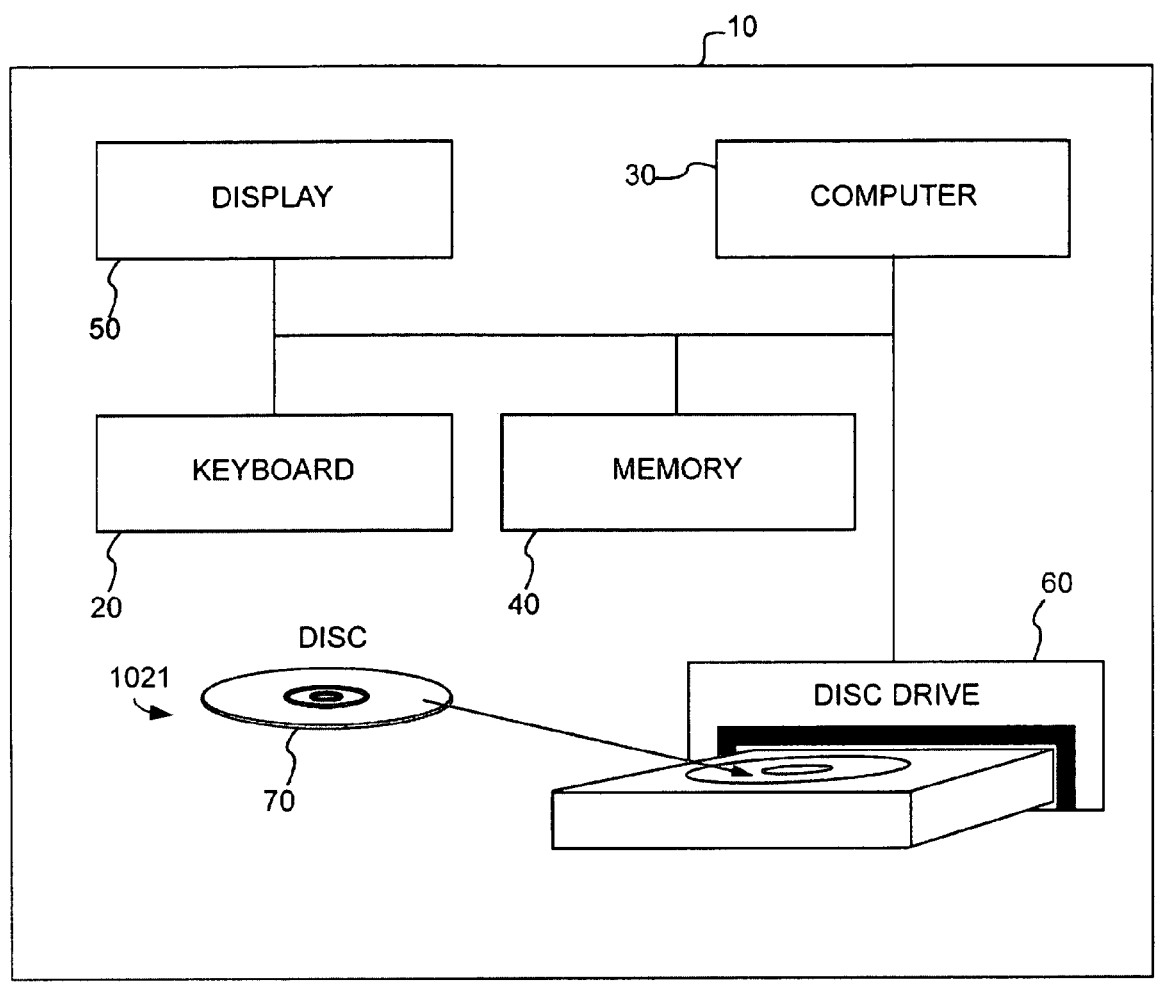
FIG. 1 is a diagrammatic illustration of a computer-aided design system, which is constructed in accordance with an embodiment of the present invention.
Figure 4:
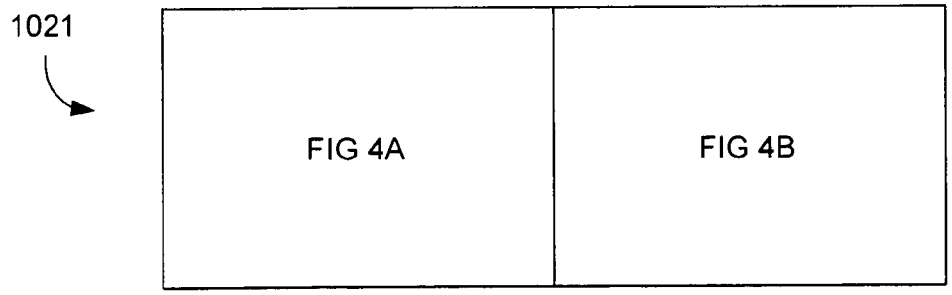
FIG. 4 is a set of flowcharts for a model based photomask synthesis algorithm implemented in accordance with a preferred embodiment of the present invention.

Referring now to the drawings and more particularly to FIGS. 1 and 4, there is illustrated a model based photomask synthesis apparatus 10 and method 1021 which are constructed in accordance with a preferred embodiment of the present invention. The apparatus 10 implements several different and unique methods of optical proximity correction which includes the method 1021 of model-based photomask synthesis. As will be explained hereinafter in greater detail, the method 1021 of model-based photomask synthesis is provided on a computer program product 70, which is a computer usable medium that has encoded thereon computer readable codes. The computer readable codes enable a user, via the CAD system 10, to apply the method 1021 of model-based photomask synthesis by changing a mask function. In this regard, the computer readable code causes the computer to take the following actions:

1) to calculate or determine a figure-of-merit for any given mask function, wherein the figure-of-merit is a measure of how well the mask function meets design goals;
2) to calculate a map of the derivative of the figure-of-merit with respect to the mask function; and
3) to adjust the mask function according to the map of said derivative to increase the figure-of-merit in order to improve image quality in a subsequent photolithographic process.

In step 3), the figure-of-merit of the mask function may be increased or in the alternative, the mask function may also be adjusted to decrease a figure-of-demerit. Either process will improve image quality in the subsequent photolithographic process, and should be considered as equivalents of one another.

Before discussing the preferred embodiment of the present invention in greater detail, it may be beneficial to briefly review the current state of the art dealing with photomask synthesis and also define various key terms that will be utilized in this disclosure.

To begin, very large-scale integrated circuits are patterned using sub-wavelength optical lithography wherein critical dimensions of patterns are less than the wavelength of the exposing light. For example, an ArF excimer laser source of 193 nm wavelength can be used to print 65 nm-wide lines. In sub-wavelength lithography, the pattern on the photomask is significantly distorted upon projection on to a wafer. Model-based optical proximity correction (MOPC) is a method of synthesizing a mask pattern that will produce a predetermined target pattern on the wafer as faithfully as possible in the presence of the distortions inherent to the patterning process. The target pattern, that is, the pattern desired on the wafer, is generated by circuit design, signal timing, layout, and routing considerations. The target pattern is represented by a set of polygons. MOPC uses a computational model of the patterning process. Typically, the computational model includes a physical-optics calculation of image formation and a model of the blur caused by molecular diffusion in the photoresist. MOPC starts with an initial guess of the photomask data, which is a set of polygons. For binary and attenuated-PSM (attenuated phase-shift mask) masks, the initial guess is similar to the target pattern. MOPC iteratively adjusts the polygons in the photomask data set in order to minimize some measure of the difference between the target pattern and the pattern predicted by the model. Adjusting the polygons is usually done by moving their edges.

Chen et al. in U.S. Pat. No. 5,242,770 teaches placing sub-resolution lines next to edges of features in order to adjust the image slope at the edge of the printing feature. Such sub-resolution lines are called scattering bars or sub-resolution assist features (SRAF). Chen et al. teach placing SRAF lines at a predetermined distance from the main lines. This approach does not apply to arbitrary 2-dimensional features (features other than straight lines).

Somekh et al. in U.S. Pat. No. 4,231,811 teach using a sub-resolution grating to adjust the amount of light transmitted through a region of a photomask.

Lin et al. in U.S. Pat. No. 4,902,899 teach halftoning a photomask using clear, opaque and phase-shifted sub-resolution features to continuously adjust the phase and amplitude of light transmitted through a region of the photomask. A sub-resolution grating with pitch <$\lambda$/(2 NA), where $\lambda$ is the exposure wavelength and NA is the numerical aperture of the projection objective, can have at most one diffraction order transmitted through the objective. Such a grating is imaged with uniform image intensity and phase since its diffraction orders cannot interfere at the image plane. The uniform intensity and phase depends on the line to space ratio (the duty cycle) of the sub-resolution grating. This principle provides a method of continuously varying the phase and amplitude of a mask function.

Chen et al. in U.S. Pat. No. 6,114,071 teach halftoning an edge of a feature on a photomask for fine-tuning the position of the printed edge.

Although the discussion that follows will be directed to a photomask, it should be understood by those skilled in the art that the present invention is also applicable to mask-less lithography, wherein the photomask is replaced by a spatial light modulator. The spatial light modulator has an array of pixels each of which can modulate light that falls on it. The pixels are controlled according to the photomask data. The spatial light modulator typically comprises an array of micromachined mirrors. The spatial light modulator is illuminated and its image is projected by an objective on to the wafer (see: Sandstrom, et al., U.S. Pat. No. 6,700,095). In view of the foregoing, in the discussion that follows, the terms "photomask data set" and "mask layout" are used synonymously and they are understood to include "mask-less lithography data set."

Several unique terms will be utilized in this specification. The following will define those terms.

Mask function m (x, y) maps the 2-dimensional (x, y) surface of the photomask to its complex-valued, local Fresnel transmission or reflection coefficient. This description includes the special case of a real-valued mask function. The mask function assigns an amplitude and a phase shift to each point (x, y) on the surface of the photomask. Usually, light that is transmitted through the photomask is projected on to a photoresist layer. In the transmission mode, the amplitude of the mask function indicates how transparent the photomask is at any point on the photomask. The larger the amplitude, the more transparent is the photomask. In some photolithography instruments, light that is reflected off a photomask is projected on to a photoresist layer. In the reflective mode, the amplitude of the mask function indicates the reflectivity of the photomask. The larger the amplitude, the more reflective is the photomask. The phase of the mask function indicates the phase shift the photomask imparts to light that is projected from a particular region of the photomask. This concept of a mask function m(x, y) is consistent with the Kirchhoff approximation (due to Gustav Kirchhoff 1824-1887) which describes diffraction as an approximately local phenomenon. A local phenomenon means, the electromagnetic field reflected by or transmitted through the mask at the point (x, y) on the photomask is influenced only by the illuminating wave and a local property m(x, y) of the mask at the same point. The local property m(x, y) is the transmission or reflection coefficient of the film stack on the photomask at point (x,y). The film stack includes any etched layer of the fused silica substrate of the photomask and thin films of materials such as $SiO_2$, TiN, MoSi, Cr deposited on the photomask. The film stack on the photomask is position-dependent since a pattern is etched on the photomask. The film stack is specified by optical refractive index, extinction coefficient, and thickness of each film, and the order of the films on the photomask. The transmission or reflection coefficient at (x, y) is calculated by assuming that the film stack at (x, y) extends endlessly in the plane of the photomask. Calculation of the transmission or reflection coefficient of a layered medium is well known (See: J. A. Kong, Electromagnetic Wave Theory, Section 3.4.C, EMW Publishing, Cambridge, Mass., 2000).

A piece-wise constant mask function is one that can be expressed as a finite summation of products of complex numbers ($m_j$) and characteristic functions $K_{polygon}$, of polygonal regions ($Polygon_j$):

$$m(x, y) = \sum_{j=1}^{N_p} m_j K_{Polygon_j}(x, y) \tag{1}$$

Characteristic function $K_\Omega$ of set $\Omega$ maps the interior of $\Omega$ to 1 and the exterior of $\Omega$ to 0.

A photolithography data set, synonymously called a photomask data set and mask layout, describes a piecewise-constant mask function. A photomask data set comprises a set of polygons wherein the mask function is substantially constant in each polygon. The photomask data set comprises (x, y) coordinates of the vertices of each polygon ($Polygon_j$), and the value of the mask function in the polygon or an index which determines the value of the mask function in the polygon. In Equation 1, the value of the mask function in the $j_{th}$ polygon is $m_j$, if the $j_{th}$ polygon does not intersect any other polygon.

A target pattern is a pattern to be formed on a wafer. The target pattern is represented by a set of target polygons. Target polygons remain invariant during optimization of the photomask. Target points are points selected on the target polygons. Design goals are enforced at the target points.

A functional is a noun in mathematics. In general, a functional is a map of a topological vector space into its scalar field. In the context of this invention, a functional maps the mask function, or a photomask data set, to a real number, which serves as a figure-of-merit of the design. The figure-of-merit is a single number that measures how well a design goal, or a desired compromise between multiple goals, is met. Equivalently, a figure-of-demerit can be used which decreases as the design goals are approached. The photomask design problem is thus, reduced to maximizing a figure-of-merit or minimizing a figure-of-demerit. When only one of the terms: figure-of-merit and figure-of-demerit, is mentioned, it is understood that either formulation is possible, and that minimizing a figure-of-demerit and maximizing a figure-of-merit are equivalents of one another.

Fréchet derivative is the rate of change in the value of a functional with respect to changes in the function on which the functional operates. The Fréchet derivative of a functional F is a linear functional T (See W. Rudin, "Functional Analysis," Definition 10.34. Mc-Graw Hill, 1973) and as such, it can be represented by an inner-product with a function $$\frac{\delta F}{\delta m}:$$

$$\lim_{\|\delta m\| \to 0} \frac{F(m+\delta m) - Fm - T\delta m}{\|\delta m\|} = 0 \quad (2)$$

$$T\delta m = \left\langle \frac{\delta F}{\delta m}, \delta m \right\rangle$$

In Equation 2, $\delta m$ is an arbitrary perturbation in the mask function, the perturbation having a small norm. The function $$\frac{\delta F}{\delta m},$$

in this specification, shall be called the Fréchet derivative of the functional F, ignoring the distinction between a linear functional and the function that represents a linear functional.

Figure 2:
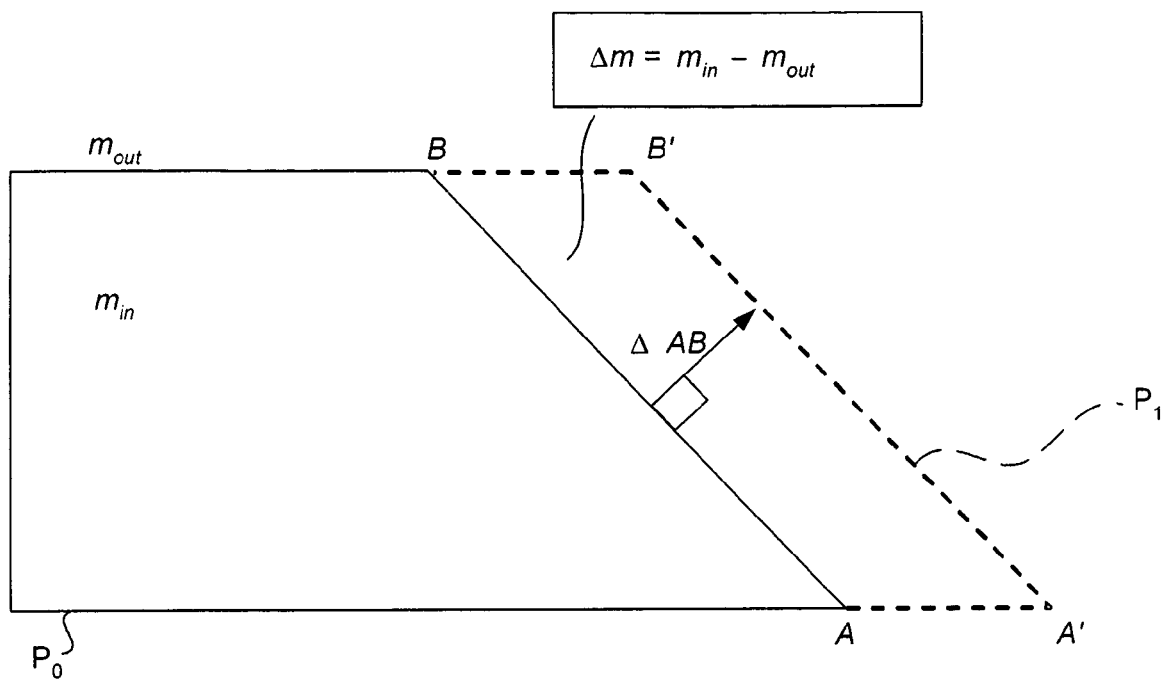
FIG. 2 is a diagrammatic illustration for helping to explain the definition of moving an edge in a polygon.

Moving an edge of a polygon, such as an edge AB of a polygon $P_0$ (FIG. 2) refers to transforming the polygon $P_0$ into another polygon $P_1$ such that: there is a one-to-one correspondence between the edges of polygon $P_0$ and the edges of polygon $P_1$; each edge of polygon $P_0$ is parallel to the corresponding edge of polygon $P_1$; the distance between edge AB and the corresponding edge A'B' of polygon $P_1$ is called an edge movement $\Delta_{AB}$; and the distance between any edge of polygon $P_0$ other than AB, and the corresponding edge of polygon $P_1$, is zero. FIG. 2 shows the transformation of one polygon into another polygon by an edge movement.

Moving edges of a polygon refers to transforming the polygon into another polygon such that the transformation is a composition of any number of transformations, wherein each transformation is moving an edge. The composition of the transformations is represented by a vector or array of edge movements, $\Delta$.

Figure 3A:
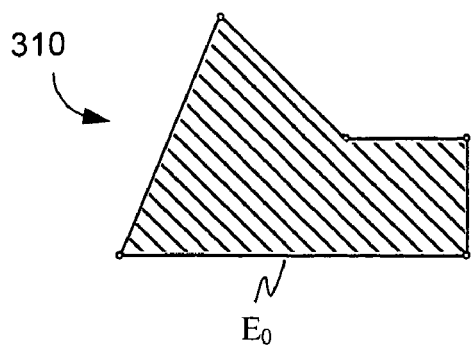
FIG. 3A-C are a diagrammatic illustration for helping to explain the definition of segmentation of an edge of a polygon.
Figure 3B:
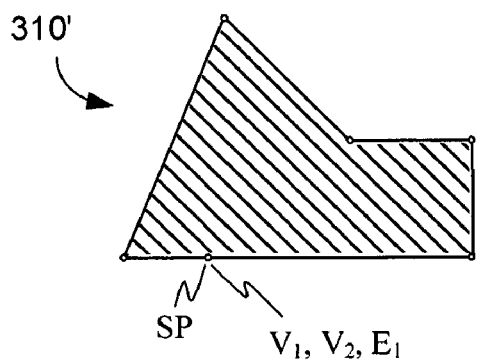
Figure 3C:
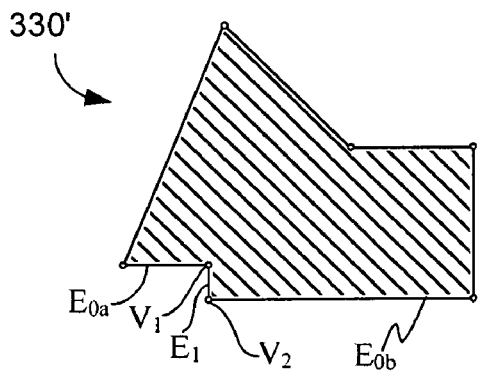

Segmenting an edge of a polygon refers to transforming a polygon, such as a polygon 310 (FIG. 3A) into another polygon 310' (FIG. 3B) with a larger number of vertices. For example, referring to FIG. 3B, segmenting comprises inserting two overlapping vertices $V_1$ and $V_2$, between which is an edge of zero-length $E_1$, at a segmentation point SP on an edge $E_O$ of a polygon 310'. Immediately after segmentation, the segmented polygon 310' has at least four colinear vertices and at least two overlapping vertices ($V_1$ and $V_2$). Segment or edge segment is synonymous with "edge" of a polygon. Segment usually refers to edges created by segmenting an edge, such as the edges $E_{Oa}$, $E_{Ob}$, and $E_1$. The segmented polygon 310' is usually further transformed by moving its edges, as illustrated in FIG. 3C, for example, to form the transformed polygon 330'. The purpose of segmenting the edges of a polygon is to increase the degrees of freedom by which the polygon can be transformed into another polygon.

Considering now the preferred method of the present invention in greater detail, each of the following are considered distinct objects: a target pattern, a mask layout, a wafer pattern that will be printed on a wafer as predicted by a computational model of patterning, and a wafer pattern that is actually printed on a wafer. The target points used for enforcing design goals are on the target polygons. The target polygons and target points are invariant during iterations of photomask synthesis. The edges of the polygons in the mask layout are segmented and moved. The segmentation points have no relation to the target points.

As will be described hereinafter in greater detail, this specification is directed to describing a photomask with a complex valued photomask function, determining a figure-of-demerit or a figure-of-demerit for any photolithographic mask function, and adjusting the photolithographic mask function to substantially reduce the figure-of-demerit or increase the figure-of-merit. The figure-of-demerit or figure-of-merit expresses the difference between a desired pattern and the pattern the photomask will produce according to computational model of patterning. The figure-of-merit or figure-of-demerit is based on such differences at a plurality of points, taken together, e.g. by summation of squares of the differences, or taking the largest of the absolute value of the differences. In addition, the figure-of-demerit or figure-of-merit can optionally include displacement of the edges of the pattern as a result of changes in the exposure dose and/or defocus. In one embodiment, the method provides means of placing opaque, clear, or phased features and subresolution assist features on a photomask. In another embodiment, the method provides means of synthesizing a photomask of continuously varying phase and amplitude.

MOPC adjusts a photomask data set so that the pattern that is transferred to the wafer by lithography is as close as possible to a target pattern. An essential ingredient of model-based lithography is a computational model of the patterning process. The intensity of the latent image in a photoresist film deposited on a wafer can be expressed as:

$$I(x, y; z) = \sum_{n=1}^{N} \mu_n \left| \int \int V_n^*(x'-x, y'-y; z) m(x', y') dx' dy' \right|^2 \quad (3)$$

(See: N. Cobb et al., "Mathematical and CAD Framework for Proximity Correction," Proc. SPIE Vol. 2726, p. 208, 1996) In Equation 3, which is derived from a Kirchhoff approximation, $\mu_1, \mu_2, \ldots, \mu_N$ are positive-valued eigenvalues and $V_1^*, V_2^*, \ldots, V_N^*$ are complex conjugates of eigenfunctions of a Hermitian, positive-semidefinite operator; and m(x,y) is the complex transmission coefficient of the mask at the point (x,y). For binary masks, m(x,y)=1 in clear areas, and m(x,y)=0 in opaque areas. In 180° phase-shifted windows on the photomask, m(x,y)=−1. In general, in a $\phi$-radian phase-shifted window, m(x,y)=$e^{i\phi}$. For an attenuated phase-shift feature with power transmission coefficient T, the mask function takes the value: m(x,y)=$e^{i\phi}\sqrt{T}$ wherein the nominal value of the phase shift is: $\phi=\pi$. For reflective masks, m(x,y) is the complex reflection coefficient of the mask at the position (x,y). The defocus variable z, denotes the axial position of the wafer with respect to best focus. The variable z is not to be confused with the axial position inside the photoresist. The goals of the photomask design are encapsulated in a real-valued figure-of-merit, or equivalently in a figure-of-demerit, which is calculated using the results of the computational model of the patterning process. The photomask design problem thus, becomes equivalent to minimizing a figure-of-demerit or maximizing figure-or-merit.

The goals of photomask design include one or more of:
1. placing the edges of the resist pattern at the corresponding edges of a target pattern;
2. maximizing the image contrast at the resist edge thereby increasing the exposure dose latitude and immunity to flare;
3. maximizing the depth of focus, i.e., enforcing 1. and 2. for a range of focus values.

Goals 1 and 3 can be achieved by minimizing a functional $F_1 m$ with respect to lithography data (mask transmission function) m:

$$F_1 m = \sum_{q=1}^{Q} \sum_{j=1}^{M} (I(x_j, y_j; z_q) - t)^2 \quad (4)$$

$F_1$ is a functional that maps a mask transmission function m to a non-negative real number which is a figure-of-demerit. In Equation 4, t denotes a threshold, which is equal to the ratio: (dose-to-clear/dose). Exposure dose, or dose for short, is light energy per unit area that is incident on the photoresist. Dose-to-clear is the minimum dose at which a positive photoresist clears or negative photoresist does not clear upon development. A positive photoresist dissolves if $I(x_j, y_j, z_q) > t$, and it does not dissolve if $I(x_j, y_j, z_q) < t$ at the location $(x_j, y_j)$ on the wafer when the defocus is $z_q$. The inequalities are reversed for a negative photoresist. Since the squared terms in Equation 4 are summed over target points $(x_j, y_j)$; $j=1, \ldots, M$ and focus values $z_1, \ldots, z_Q$, resist edges go through all M target points, for all Q focus values if and only if $F_1 m=0$. In practice, $F_1 m=0$ is usually not feasible; therefore the photomask is designed by minimizing $F_1 m$. This description embodies the special case Q=1 where Equation 4 is evaluated for a single focus value, such as the best focus, z=0. Using a single focus value reduces the computation time. The target points are points selected on the edges of the target polygons. The image intensity is band-limited with a Nyquist sampling rate of 0.25 $\lambda$/NA, where $\lambda$ is the exposure wavelength and NA is the numerical aperture. Since the image is band-limited, placing the target points arbitrarily densely increases computational time with little benefit. A preferred value for the spacing of target points on an edge is ~0.2 $\lambda$/NA. Not placing target points on corners of target polygons is good practice since resist edge cannot have sharp corners.

Goals 1, 2 and 3 can be achieved by minimizing $F_2 m$ with respect to lithography data (mask transmission function) m:

$$F_2 m = \sum_{q=1}^{Q} \sum_{j=1}^{M} \frac{(I(x_j, y_j; z_q) - t)^2 + \alpha}{\left(tol_j \frac{\partial I}{\partial n}(x_j, y_j; z_q)\right)^2} \quad (5)$$

$F_2$ is a functional that maps a mask transmission function m to a non-negative real number, which is a figure-of-demerit. Minimizing $F_2 m$ forces the resist edge to go through the target points $(x_j, y_j)$; $j=1, \ldots, M$ for focus values $z_1, \ldots, z_Q$. The image-slope $$\frac{\partial I}{\partial n}(x_j, y_j; z_q)$$

is the directional derivative of the image in the direction that is perpendicular to the target edge. The following term is a first-order estimate of the edge-placement error (EPE) at the $j^{th}$ target point and $q^{th}$ defocus value:

$$EPE_{j,q} \equiv \text{Edge placement error at } (x_j, y_j; z_q) \quad (6)$$

$$= \frac{I(x_j, y_j; z_q) - t}{\frac{\partial I}{\partial n}(x_j, y_j; z_q)}$$

The edge placement error is normalized with the edge placement tolerance $tol_j$ for the $j^{th}$ target point:

$$\text{Relative edge placement error at } (x_j, y_j; z_q) = \frac{I(x_j, y_j; z_q) - t}{tol_j \frac{\partial I}{\partial n}(x_j, y_j; z_q)} \quad (7a)$$

Edge placement error depends on the exposure dose. If the exposure dose is increased by $\Delta$dose, such that $\Delta$dose/dose$\ll 1$, then the edge placement error changes as follows:

$$EPE_{j,q}(\Delta \text{dose}) = \frac{I(x_j, y_j; z_q) - \left(1 - \frac{\Delta \text{dose}}{\text{dose}}\right) t}{\frac{\partial I}{\partial n}(x_j, y_j; z_q)} \quad (7b)$$

If the sum of $[EPE_{jq}^2(+\Delta \text{dose}) + EPE_{jq}^2(-\Delta \text{dose})]/tol_j^2$ over all target points is minimized, then the figure-of-demerit $F_2 m$ in Equation 5 is derived as follows:

$$F_2 m = \sum_{q=1}^{Q} \sum_{j=1}^{M} \frac{(I(x_j, y_j; z_q) - t)^2 + \left(\frac{\Delta \text{dose}}{\text{dose}} t\right)^2}{\left(tol_j \frac{\partial I}{\partial n}(x_j, y_j; z_q)\right)^2} \quad (7c)$$

This determines the value of the parameter $\alpha$ as:

$$\alpha = \left(\frac{\Delta \text{dose}}{\text{dose}} t\right)^2 \quad (7d)$$

As an alternative approach, the figure-of-demerit $F_2 m$ in Equation 5 is achieved by introducing edge-displacement (ED) induced by dose-variation:

$$ED_{j,q}(\Delta \text{dose}) \equiv \text{Edge displacement induced} \quad (7e)$$

-continued $$\text{by dose variation at } (x_j, y_j; z_q) = \frac{\frac{\Delta \text{dose}}{\text{dose}} t}{\frac{\partial I}{\partial n}(x_j, y_j; z_q)}$$

If the sum of $[EPE_{jq}^2 + ED_{jq}^2(\Delta \text{dose})]/tol_j^2$ over all target points is minimized, then again the figure-of-demerit $F_2m$ in Equation 5 is derived, with the value of the parameter α given by Equation (7d).

Minimizing a sum-of-squares as indicated by Equation 4 or Equation 5 is convenient for optimization because it leads to a figure-of-demerit that is continuously differentiable with respect to the movements of the polygon edges or with respect to the value of the mask function in any neighborhood. Many other formulations of figure-of-demerit can be used although they are not preferred. Examples of alternative figure-of-demerit formulations are given as follows:

$$F_3m = \max_{j,q} \frac{EPE_{jq}}{tol_j} \quad (7f)$$

$$F_4m = \sum_{q=1}^{Q} \sum_{j=1}^{M} \frac{|EPE_{jq}| + |ED(\Delta \text{dose})|}{tol_j} \quad (7g)$$

By virtue of having the image slope in the denominator, minimizing the figure-of-demerit $F_2m$ enforces having a high image contrast at each target point. The optional, positive parameter α in the numerator of Equation 5 emphasizes the requirement of large image slope at the edges of the target polygons.

A high image slope increases the dose latitude and decreases the sensitivity of the printed pattern to lens flare (scattered light). The terms in Equation 5 are summed over the target points and over a few focus settings $z_1, z_2, \ldots, z_Q$. Typically using two focus settings such as $z=0$ (best focus) and $z=$(depth of focus)/2 is sufficient. A single focus value such as the best focus $z=0$ may be used to reduce the computation time.

Minimizing Fm forces the resist edge to go through the target points but that does not preclude presence of resist edges where there are no target points. Without additional constraints, minimizing the figure-of-demerit in Equation 4 or Equation 5 can result in spurious resist features in large clear areas, away from the target points. It can also cause spurious holes in large resist areas away from the target points. Additional constraints may be needed when the target pattern has large clear or large opaque features:

$I(x_j^{(c)}, y_j^{(c)}, z_q) \geq t_U > t$ for $(x_j^{(c)}, y_j^{(c)})$ in clear areas and opaque assist features (8)

$I(x_j^{(c)}, y_j^{(c)}, z_q) \leq t_L < t$ for $(x_j^{(c)}, y_j^{(c)})$ in opaque areas and clear assist features The control points $(x_j^{(c)}, y_j^{(c)})$ are placed where resist edges are not wanted, that is, anywhere other than the edges of the target polygons. In particular, control points may be placed on assist features and in between features where the process window is likely to be narrow. Constraint Equation 8 assumes a positive photoresist. For negative photoresists, the words opaque and clear are to be interchanged. The intensity safety margins $t_U$ and $t_L$ are determined by the desired dose latitude. Typical spacing of the control points is $0.25 \lambda/NA$. The functional $F_1m$ or $F_2m$ is minimized subject to the constraints of Equation 8.

The image intensity at a point is a quadratic functional of the mask function according to Equation 3. The figure-of-demerit in turn is a simple function (quadratic in the case of Equation 4 and rational polynomial in the case of Equation 5) of the intensity. The variation of the figure-of-demerit in Equation 4 with respect to changes in the mask function is:

$$\frac{\delta F_1 m}{\text{Re}\, \delta m}(x'', y'') = \quad (9)$$

$$4 \sum_{q=1}^{Q} \sum_{j=1}^{M} (I(x_j, y_j; z_q) - t) \sum_{n=1}^{N} \mu_n \text{Re}\{Q_{nj} V_n^*(x'' - x_j, y'' - y_j; z_q)\}$$

$$\frac{\delta F_1 m}{\text{Im}\, \delta m}(x'', y'') =$$

$$-4 \sum_{q=1}^{Q} \sum_{j=1}^{M} (I(x_j, y_j; z_q) - t) \sum_{n=1}^{N} \mu_n \text{Im}\{Q_{nj} V_n^*(x'' - x_j, y'' - y_j; z_q)\}$$

$$Q_{nj} = \int\int V_n(x' - x_j, y' - y_j; z) m^*(x', y') dx' dy'$$

The first and second lines in Equation 9 express the rate of change of the figure-of-demerit with respect to the real and imaginary parts of the mask function, respectively, at an arbitrary point (x",y") on the mask. The points $(x_j, y_j); j=1, \ldots, M$ above are target points selected on target polygons. The Fréchet derivative in Equation 9 indicates how to alter the phase and amplitude of the mask function at any point on the mask in order to decrease the figure-of-demerit. This provides a rigorous method by which sub-resolution halftoning can be applied to approach the design goals.

Moving an edge AB of a polygon $P_0$ by an amount $\Delta_{AB}$ to A'B', as shown in FIG. 2, changes the value of the mask function only in the region AA'B'B. For a piecewise-constant mask function, the value of the mask function at any point in AA'B'B changes by:

$\Delta m = m(\text{inside } P_0) - m(\text{outside } P_0)$ (10)

Consider an infinitesimal segment of an edge, the segment that is centered at (x",y") and of length dl. The derivative of the figure-of-demerit with respect to the movement A of the infinitesimal segment per segment length is:

$$\Psi(x'', y'') \equiv \frac{\partial F_1 m}{\partial \ell \partial \Delta} = 4 \sum_{q=1}^{Q} \sum_{j=1}^{M} (I(x_j, y_j; z_q) - t) \quad (11)$$

$$\sum_{n=1}^{N} \mu_n \text{Re}\{\Delta m(x'', y'') Q_{nj} V_n^*(x'' - x_j, y'' - y_j; z_q)\}$$

The derivative of the figure-of-demerit with respect to the movement $\Delta_{AB}$ of the entire edge AB as one unit is:

$$\frac{\partial F_1 m}{\partial \Delta_{AB}} = 4 \sum_{q=1}^{Q} \sum_{j=1}^{M} (I(x_j, y_j; z_q) - t) \quad (12)$$

$$\sum_{n=1}^{N} \mu_n \int_{AB} \text{Re}\{\Delta m(x'', y'') Q_{nj} V_n^*(x'' - x_j, y'' - y_j; z_q)\} d\ell''$$

The line-integral above is taken over the edge AB. The double prime on $dl''$ indicates the variables of integration are $(x'',y'')$. The derivative of the figure-of-demerit $F_2m$ in Equation 5 is calculated similarly.

An array (vector) of available edge movements is designated as $\Delta$. Some edges in the mask layout may not be movable; in which case, they are excluded from the array $\Delta$. For example, edges that have been optimized in a previous process may be marked as not movable in a subsequent process. The design of the mask layout is reduced to minimizing a figure-of-demerit such as $F_1m$ in Equation 4 or $F_2m$ in Equation 5 with respect to the vector $\Delta$. Standard techniques of optimization, such as the Gauss-Newton algorithm (See: Gill, Murray and Wright, Practical Optimization, Elsevier, 1986) can be used to minimize the figure-of-demerit. Explicitly calculating the derivative of the figure of merit, as in Equation 12, makes the numerical implementation of the optimization algorithm more efficient.

To describe the use of the Gauss-Newton algorithm in this context, the vector-valued, multi-variate function $f(\Delta)$ is introduced. In the case of the figure-of-demerit defined by Equation 4, the j, $q^{th}$ entry of vector $f(\Delta)$ is:

$$f_{jq}(\Delta) = I(x_j, y_j, z_q) - t \quad (13)$$

The function $f: R^N \mapsto R^{QM}$ maps $\Delta \in R^N$, the array of N edge movements, into a vector of QM real numbers. M is the number of target points; and Q is the number of focus values, which can be 1. Similarly, for the figure-of-demerit defined by Equation 5, the j, $q^{th}$ entry of vector $f(\Delta)$ is:

$$f_{jq}(\Delta) = \frac{I(x_j, y_j; z_q) - t}{tol_j \frac{\partial I}{\partial n}(x_j, y_j; z_q)} \quad \text{for } \alpha = 0 \quad (14)$$

For convenience, the two indices of $f_{jq}(\Delta)$ are collapsed into one. In other words, $f(\Delta)$ is re-arranged into a column-vector and refer to the $p^{th}$ entry of this column vector as $f_p(\Delta)$. A Jacobian matrix J is defined by:

$$J_{pq}(\Delta) \equiv \frac{\partial f_p}{\partial \Delta_q} = \sum_{n=1}^{N} \mu_n \int_{AB} \text{Re}\{\Delta m(x'', y'') Q_{nj} V_n^*(x_j, -x'', y_j - y''; z_q)\} dl'' \quad (15)$$

Unconstrained minimization of the figure-of-demerit by the Gauss-Newton algorithm leads to the following iteration, where the superscript$^{(n)}$ is the iteration index:

$$J(\Delta^{(n)})[\Delta^{(n)} - \Delta^{(n+1)}]^{LSQ} = f(\Delta^{(n)}) \quad (16)$$

The linear Equation 16 is solved in the least-squares sense, taking into account the possibility that the rank of the matrix $J(\Delta^{(n)})$ can be less than the number of its columns to working precision. In that case, Equation 16 needs to be regularized, which can be done by the singular value decomposition or QR-factorization of $J(\Delta^{(n)})$ (See: G. H. Golub, C. F. Van Loan, Matrix Computations, Sect. 5.2, John Hopkins University Press, Baltimore, 1966), or by solving its regularized normal equation:

$$\Delta^{(n)} - \Delta^{(n+1)} = [J^T J + \epsilon I]^{-1} J^T f(\Delta^{(n)}) \quad (17)$$

In Equation 17, $\epsilon$ is a small, positive regularization parameter and I is the identity matrix. The method of Equation 17 is not preferred because it is inefficient. A preferred method of solving Equation 16 is the least-square algorithm LSQR described in: C. C. Paige and M. A. Sunders, ACM Trans. Math. Software, Vol. 8, No. 2, June 1982, p. 195-209, which is hereby incorporated by reference in its entirety as though fully set forth herein.

Equation 16 is iterated until the figure-of-demerit is sufficiently small, or $\Delta^{(n)}$ ceases to change significantly, or a predetermined number of iterations or a specific computation time limit is reached.

A mask function that has a continuously changing phase and amplitude can be designed by using the Fréchet derivative and the steepest descent iteration:

$$m^{(n+1)} = m^{(n)} - \gamma \left[ \frac{\delta F_1 m}{\text{Re } \delta m} + i \frac{\delta F_1 m}{\text{Im } \delta m} \right]^{(n)} \quad (18)$$

$\gamma$ is such that: $F_1 m^{(n+1)} < F_1 m^{(n)}$

The superscript$^{(n)}$ in Equation 18 is the iteration number and $i^2 = -1$. The step size $\lambda$ is set to a predetermined positive number. If the figure-of-demerit does not decrease upon taking the steepest descent step of Equation 18, the mask function is not updated, $\lambda$ is decreased, for example by dividing by 2, and the step of Equation 18 is repeated. The backtracking on a line is repeated until $F_1 m^{(n+1)} < F_1 m^{(n)}$ is satisfied.

Referring to FIG. 4, a process 400 for model-based generation of assist features is shown. The process 400, begins at a start step 402 and proceeds to a providing step 404. Step 404 provides an initial mask layout. The initial mask layout selected is similar to a target layout for binary and attenuated-PSM masks. No assist features are included in the initial mask layout in the preferred embodiment of the present invention.

Next, the process proceeds to step 406 which optimizes the edge movements of polygons. Step 406 will be more fully described with reference to FIG. 4B.

Next a decision step 407 is followed to determine whether the design goals have been reached, or whether a maximum number of iterations in the process has been exceeded. If this condition is satisfied, the current iteration of the mask layout becomes the final mask layout and process 400 terminates at 416. Procedure 400 is then repeated in another part of the integrated circuit until the entire chip layout is exhausted.

If a determination is made that the design goal has not been reached or that a maximum number of iteration has not been exceeded, the process continues to step 408.

Step 408 set an assist feature exclusion zone in a neighborhood of all edge polygons. Once the exclusion zones are set, the process goes to a calculate step 410.

The calculate step 410 cause a Fréchet derivative to be calculated. Once the Fréchet derivative is calculated, the process advances to an insert step 412 to insert assist features in the complement of the exclusion zone, according to the Fréchet derivative. Depending on the mask technology, opaque, attenuated-phase-shifted, or clear and 180°-phase shifted assist apertures are inserted in the complement of the exclusion zone where $$\frac{\delta Fm}{\text{Re } \delta m}$$

s positive. In the preferred embodiment, the first assist feature is centered where $$\frac{\delta Fm}{\text{Re}\,\delta m}$$

is largest in the complement of the exclusion zone. A neighborhood of the inserted assist feature is excluded; and another opaque or 180°-phased assist feature is inserted where $$\frac{\delta Fm}{\text{Re}\,\delta m}$$

is positive and largest in the remaining complement of the exclusion region. This process is iteratively repeated. Clear assist features are inserted in the complement of the exclusion zone where $$\frac{\delta Fm}{\text{Re}\,\delta m}$$

is negative. The first clear assist feature is centered where $$\frac{\delta Fm}{\text{Re}\,\delta m}$$

attains its largest absolute value among the points where $$\frac{\delta Fm}{\text{Re}\,\delta m}$$

is negative in the complement of the exclusion zone. A neighborhood of the inserted clear assist feature is excluded and another clear assist feature is inserted where $$\frac{\delta Fm}{\text{Re}\,\delta m}$$

attains its largest absolute value among the points $$\frac{\delta Fm}{\text{Re}\,\delta m}$$

where is negative in the remaining complement of the exclusion region. In opaque regions where $$\left|\frac{\delta Fm}{\text{Re}\,\delta m}\right|$$

is small but $$\frac{\delta Fm}{\text{Im}\,\delta m}$$

positive or negative, and large in magnitude, a −90° or +90° phase shifted assist feature can be inserted, respectively. At a later iteration of algorithm 400, a previously inserted assist feature may be resized, deleted or translated at step 412 according to the value of the derivative $$\frac{\delta Fm}{\text{Re}\,\delta m}.$$

For example, if $$\frac{\delta Fm}{\text{Re}\,\delta m}$$

is negative over a substantial part of an opaque assist feature, part or all of that assist feature is removed. Once assist features are inserted and/or adjusted, the process returns to step 406 to optimize the movement of polygon edges.

Figure 4A:
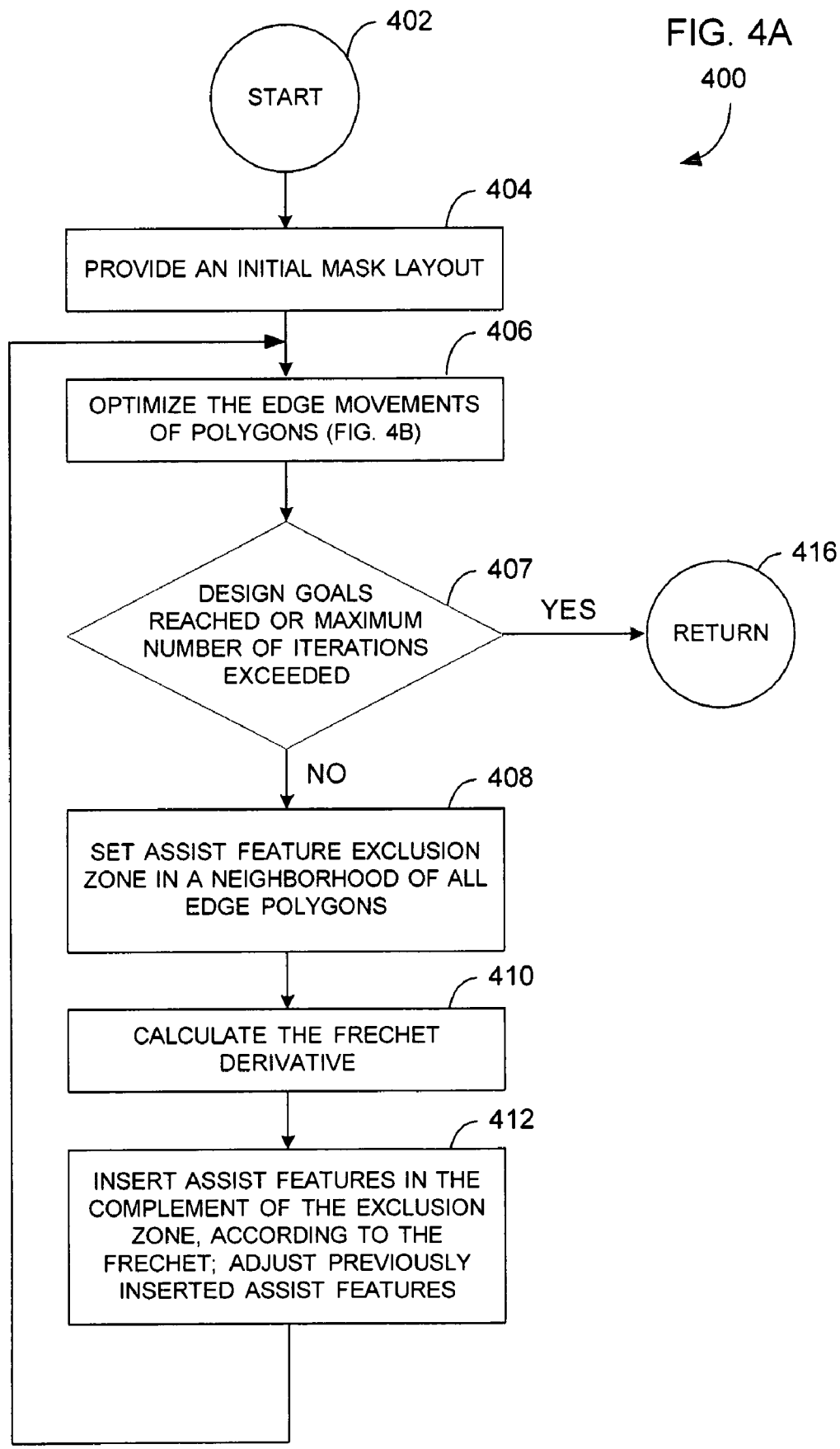
Figure 4B:
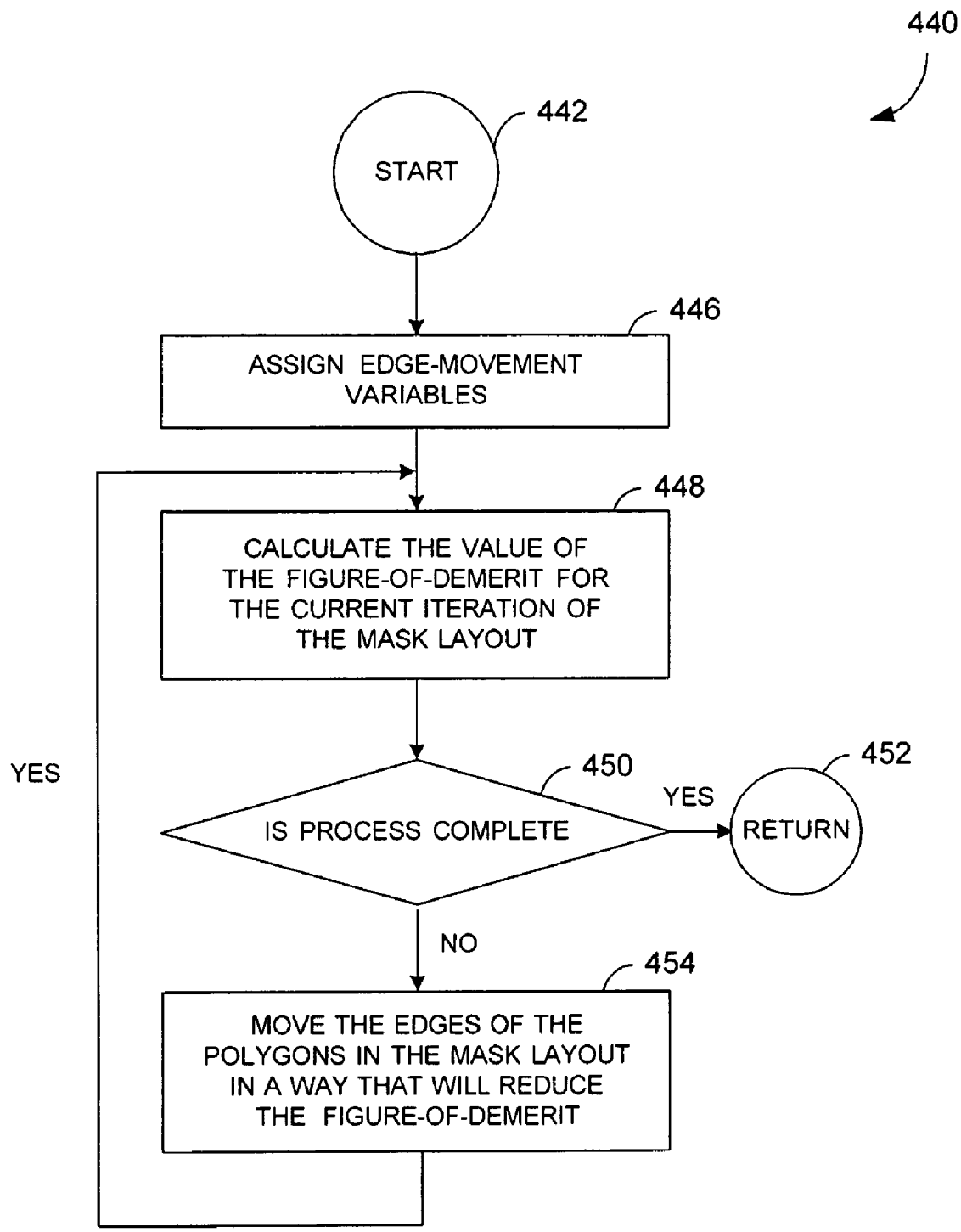

Considering now FIG. 4B and the optimization of edge movements in greater detail, when the optimization process is required that process proceeds from a start step 442 to an assign step 446 where an optimization variable $\Delta_j$ is assigned to the $j^{th}$ movable edge. Some polygon edges may be designated as not movable.

Next, the process goes to a calculate step 448 which calculates the value of the figure-of-demerit for the current iteration of the mask layout. Once this is calculated, the process advances to a decision step 450.

At the decision step 450 a determination is made relative to whether the process is complete. The process is deemed complete if the figure-of-demerit has been sufficiently decreased, or it cannot be further decreased by a significant amount by moving the edges of polygons, or a predetermined maximum number of iterations have been reached in process 440. If the process is complete, a return step 452 is executed which returns the process to step 407 (FIG. 4A). If the process is not complete, the process advances to step 454.

At step 454, edge movements are calculated according to Equation 16 in order to decrease the value of the figure-of-demerit. Solution of Equation 16 assigns movements to all moveable edges in one step. The polygons in the mask layout are transformed according to the calculated edge movements and the process returns to step 448.

It should be noted that during the optimization process 440, the edges of the polygons are moved to minimize the figure-of-demerit; the Fréchet derivative of the figure-of-demerit is recalculated; and the edges are further segmented according to the Fréchet derivative. For a detailed discussion of this process, refer to U.S. patent application Ser. No. 11/203,522, which is related to this application and which has been incorporated by reference. Alternatively, edges can be segmented based on predetermined rules.

The algorithm 400 is iterated until specific design goals are met or a predetermined number of iterations or computation time is exceeded.

In one specific embodiment of the invention, the Fréchet derivative is calculated for a set of defocus and dose values, according to Equation 4 or Equation 5, with Q>1. In an alternative embodiment, a first set of dose and defocus values, preferably the best dose and defocus, are utilized. In yet another alternative embodiment, a second set of dose and defocus values, such as the maximum defocus at which the process is expected to run, are utilized.

Figure 5:
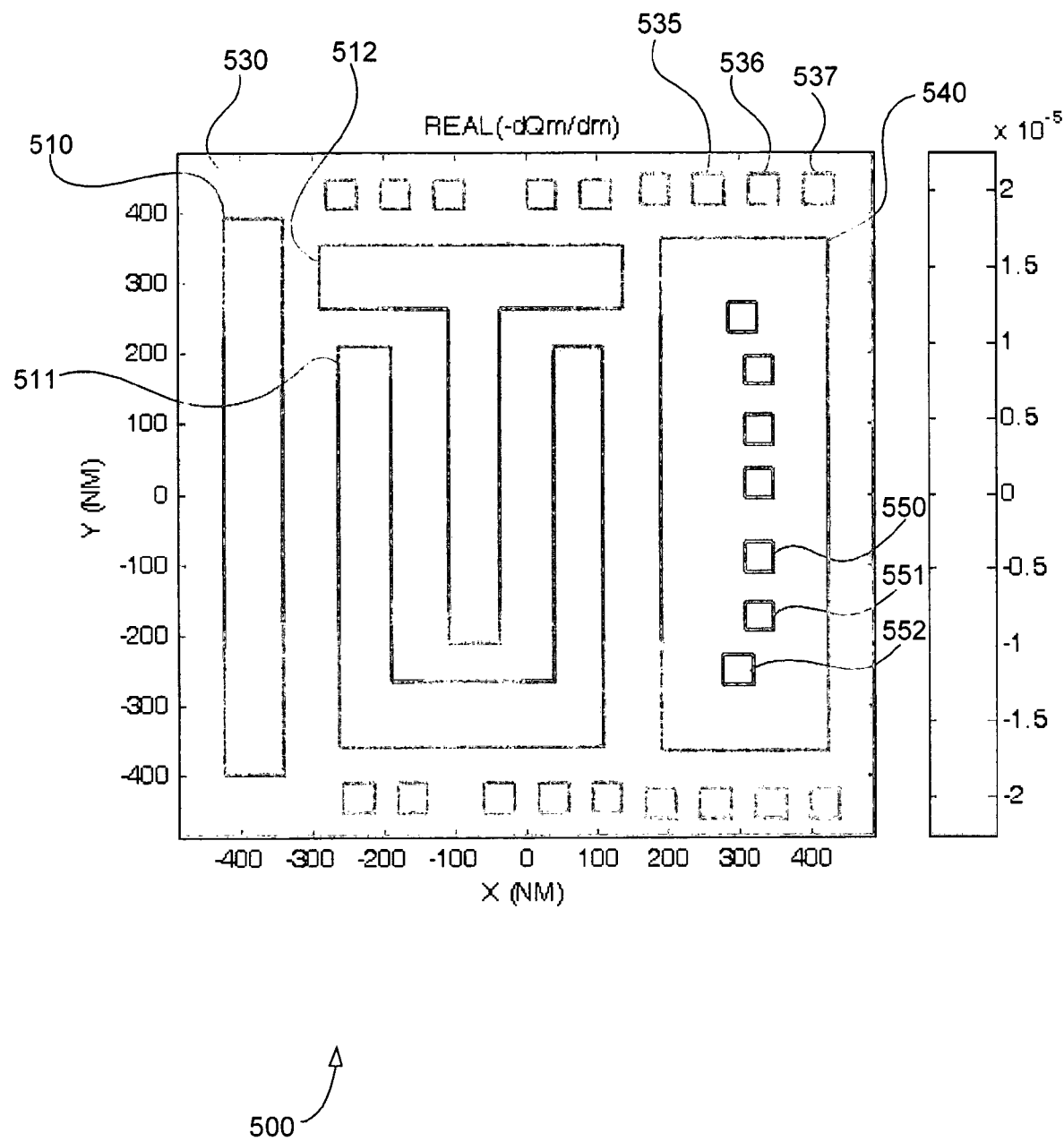
FIG. 5 is a gray-scale map of a Fréchet derivative of a figure-of-merit.

FIG. 5 is an illustrative example of the process at steps 410 and 412. Attenuated-PSM features, such as the features 510-512, in a mask layout 500 have been resized in order to minimize the figure-of-demerit at the best focus. The Fréchet derivative, $$-\frac{\delta Fm}{\operatorname{Re} \delta m},$$

calculated at 150 nm defocus, is indicated by a gray-scale map 530. Light tones on the map 530 corresponding to positive values of $$-\frac{\delta Fm}{\operatorname{Re} \delta m}$$

such as at 550-552, indicate where increasing the transmissivity of the mask will reduce the figure-of-demerit. Dark tones on the map 530, corresponding to negative values of $$-\frac{\delta Fm}{\operatorname{Re} \delta m},$$

such as 535-537, indicate where decreasing the transmissivity of the mask will reduce the figure-of-demerit. Attenuated-PSM, square-shaped assist features are placed one at a time, starting at the lowest value of the map. The size of the assist features is 42 nm in this example. In general, this dimension is set to the smallest possible mask dimension. A ξ=70 nm neighborhood of each edge is excluded in placing the centers of the assist features. This determines the smallest distance between an assist feature and an edge (49 nm in this example) of a polygon 540. Clear assist features 550-552 are placed on attenuated-PSM features 540. The clear assist features 550-552 are placed one at a time, starting at the highest or brightest value of the map 530. Once an assist feature is placed, a neighborhood of it is excluded from assist placement. This determines the closest distance between the assist features, which has to conform to the mask writing rules.

Figure 6:
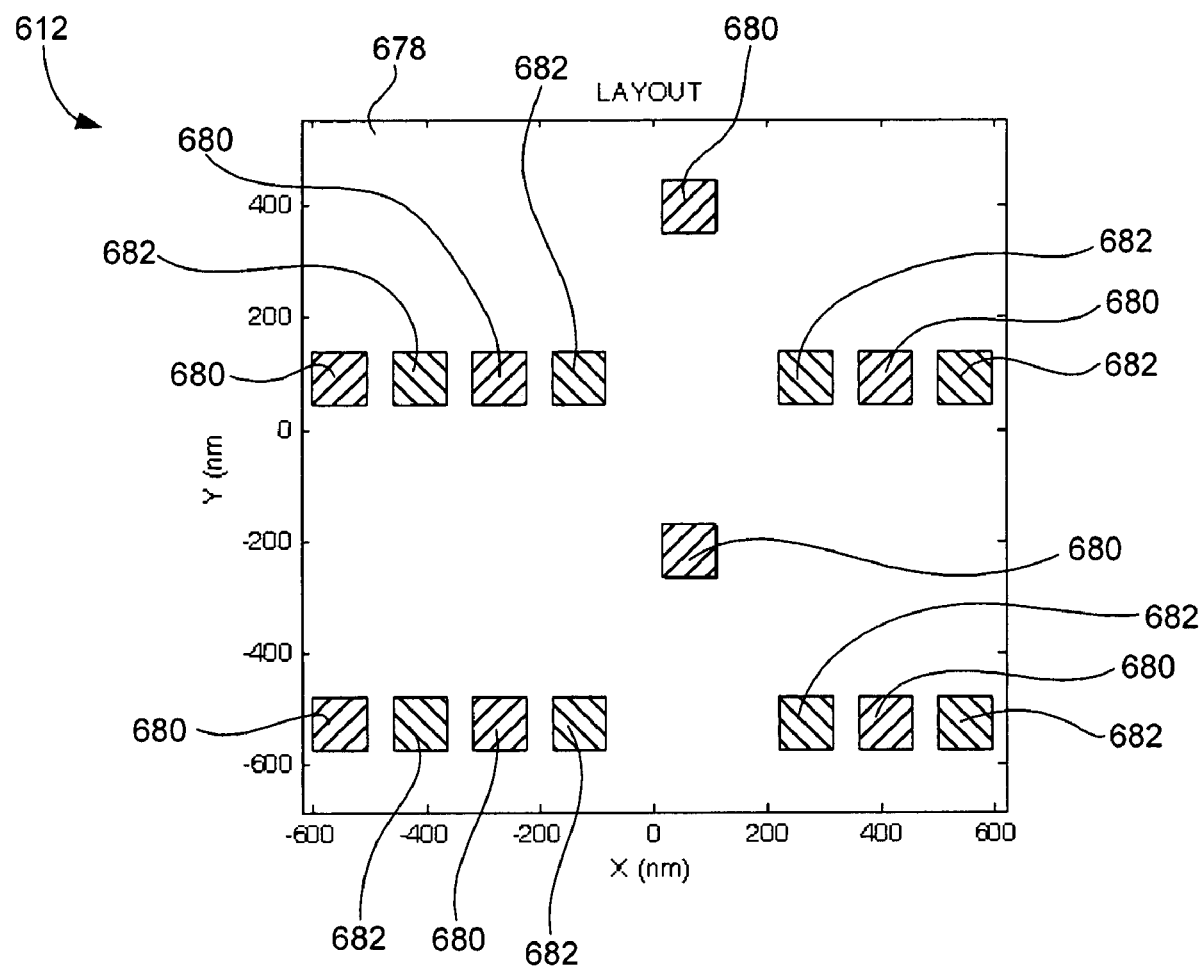
FIG. 6 is a diagrammatic illustration of an initial mask layout for a contact layer.

FIG. 6 is an illustrative example of an initial guess of a mask transmission function for a contact layer. A mask 612 has an opaque (chrome) background indicated generally 678. The initial guess for the mask layout has 180° phase shifted apertures 680 and 0° degree phase shifted apertures 682.

Figure 7:
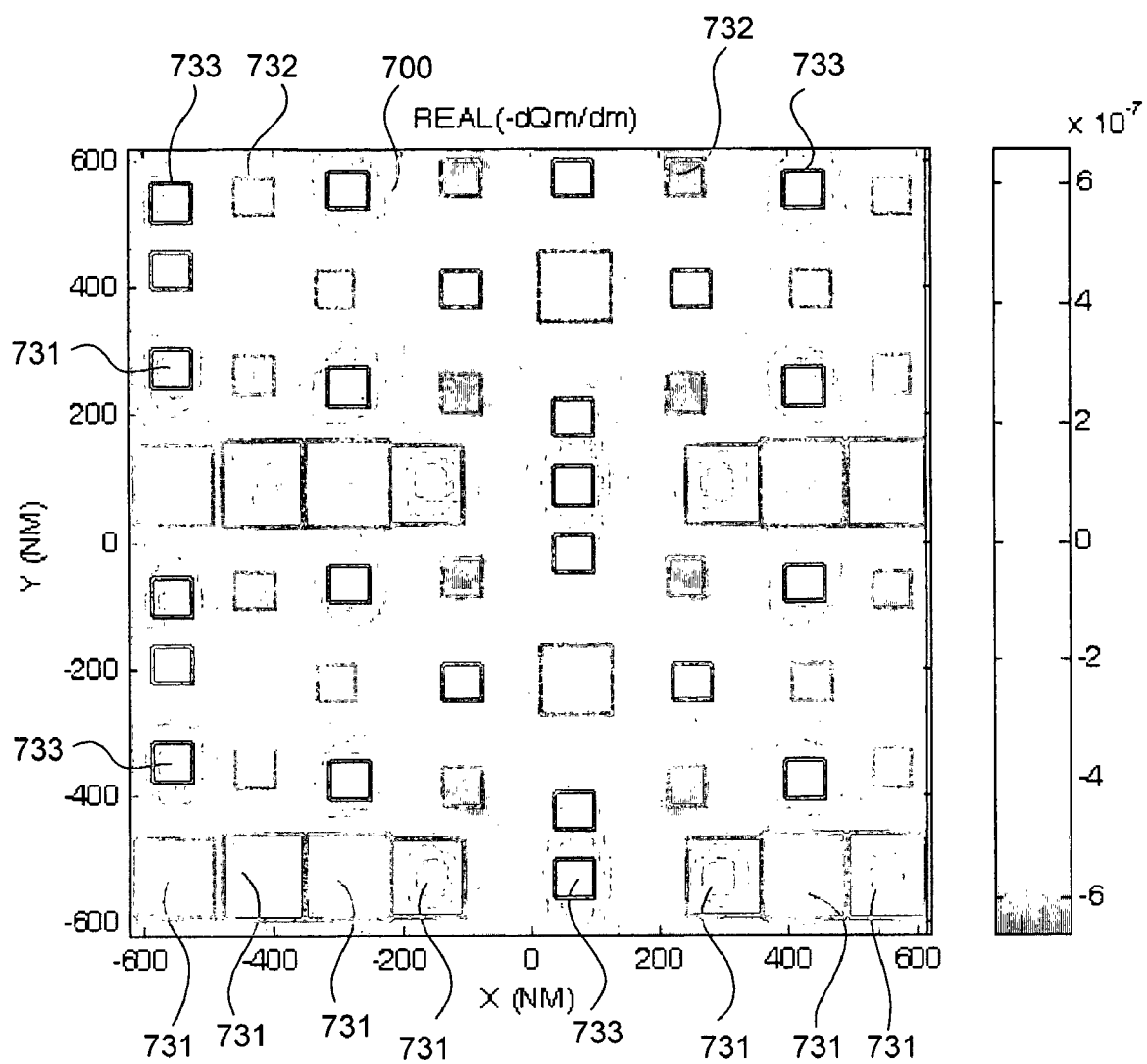
FIG. 7 is a gray-scale map of the Fréchet derivative of a figure-of-merit for the layout illustrated in FIG. 6.

FIG. 7 is an illustrative example of steps 410-412 for the example in FIG. 6. The apertures 680 and 682 with alternating phases are resized (731) by minimizing the figure-of-merit with respect to the edge movements. The negative of the real part of the Fréchet derivative, $$-\frac{\delta Fm}{\operatorname{Re} \delta m},$$

calculated at best focus, is shown as a gray-scale map 700. 180° degree phase shifted assist features 732 are placed at the negative-valued minima of the map 700. 0° phase shifted assist features 733 are placed at the positive-valued peaks of the map 700.

Figure 8:
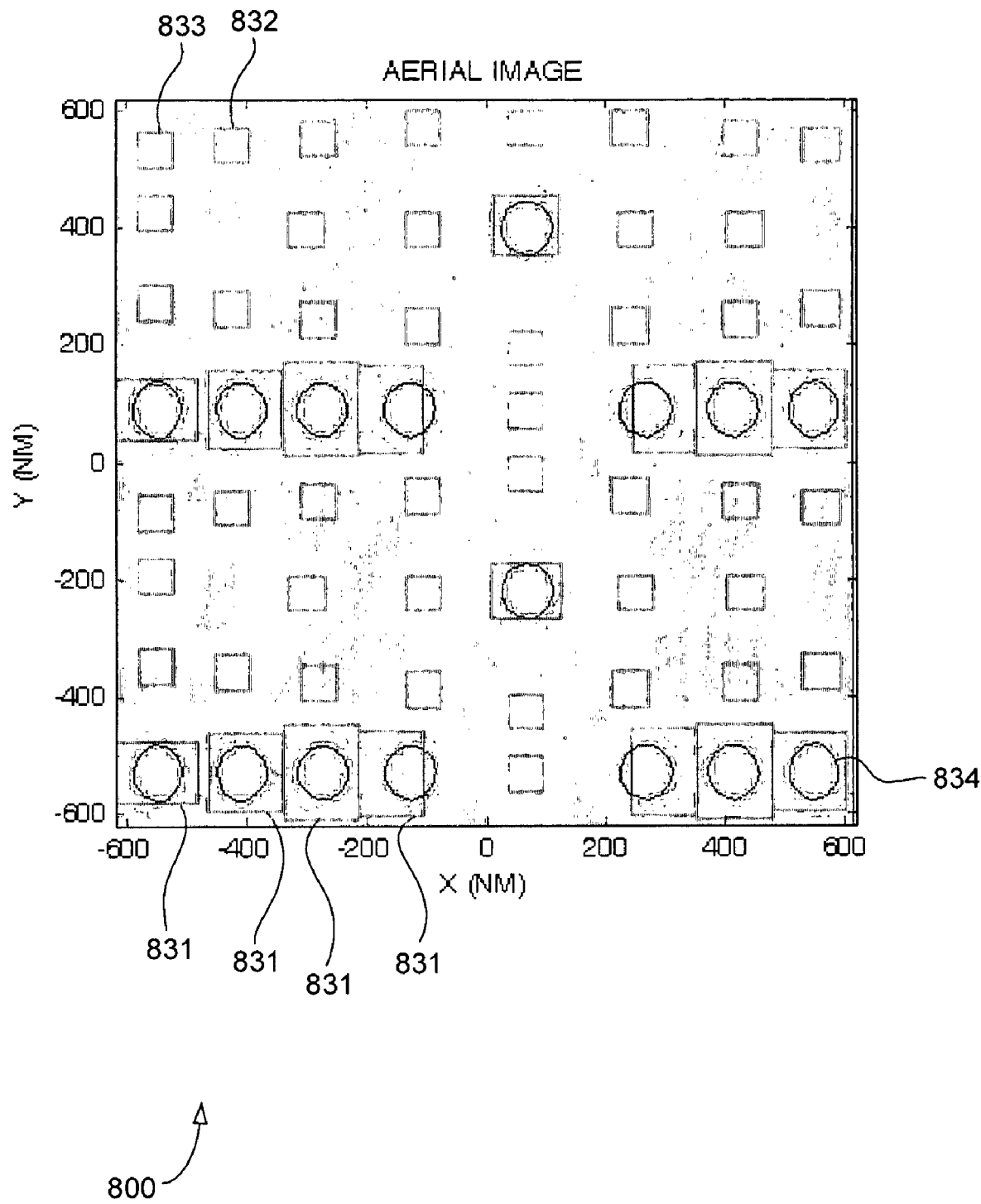
FIG. 8 is a gray scale map of the image intensity produced by the mask layout illustrated in FIG. 7.
Figure 9A:
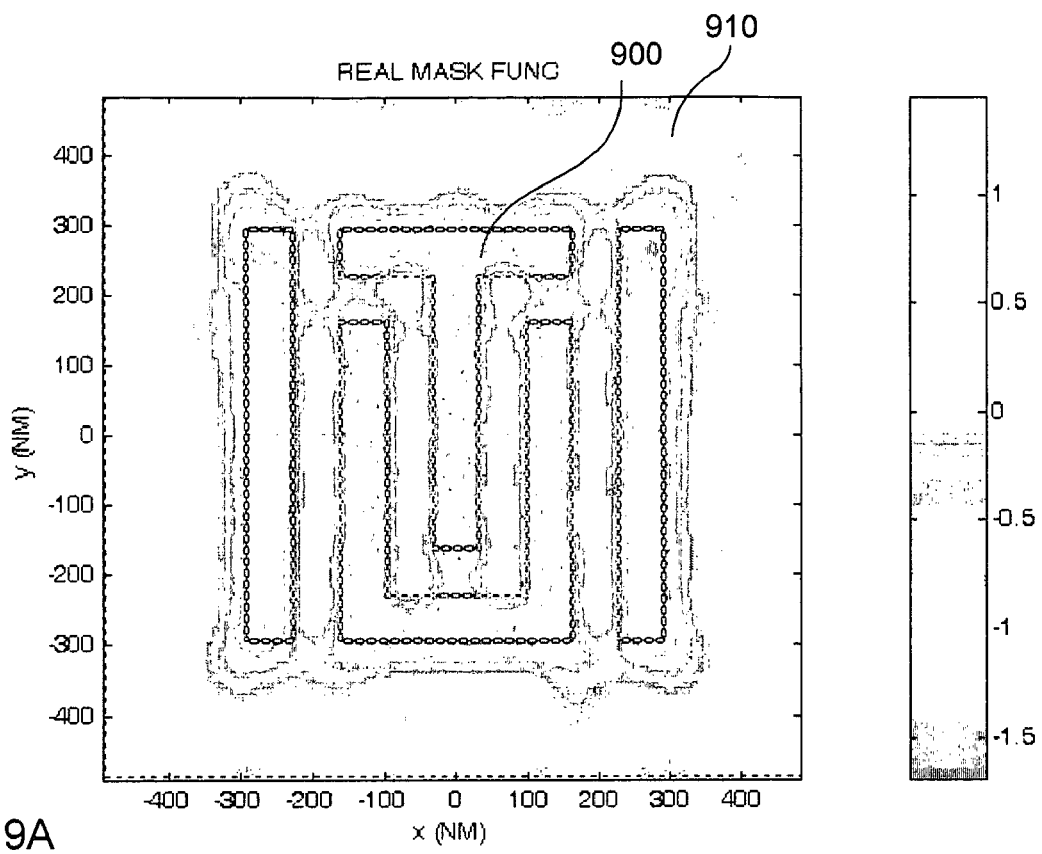
FIGS. 9A-D are gray scale maps illustrative of a continuous-amplitude, continuous-phase photomask mask designed in accordance with a preferred embodiment of the present invention.
Figure 9B:
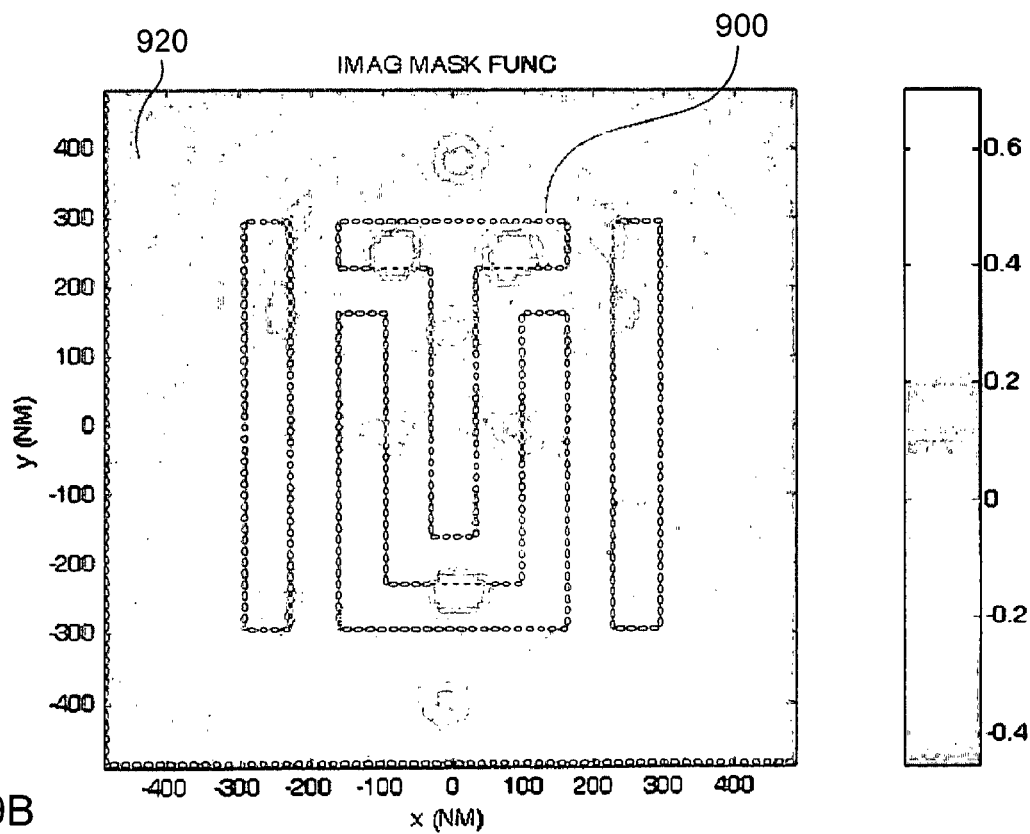
Figure 9C:
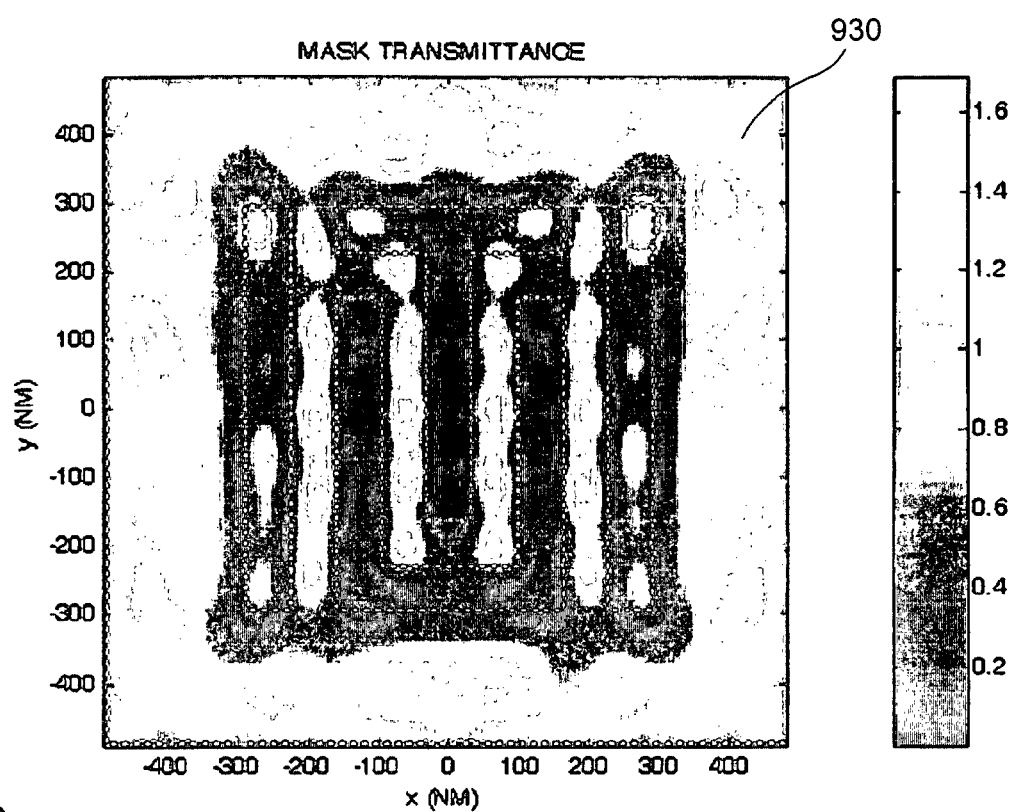
Figure 9D:
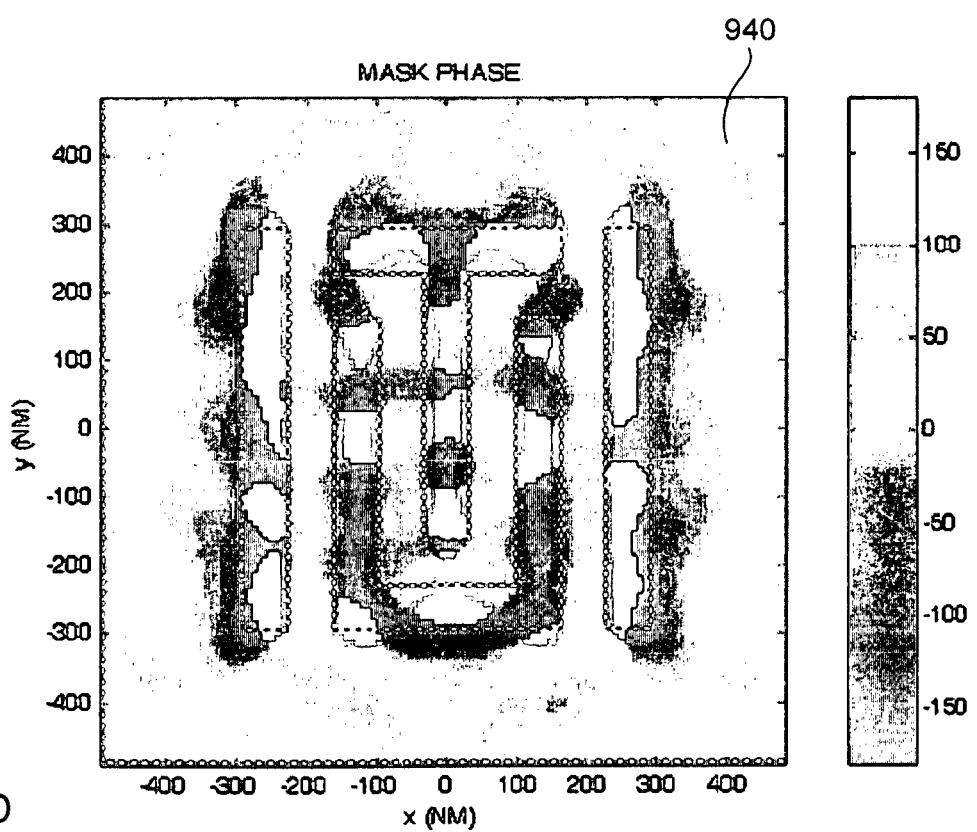

FIG. 8 shows the image intensity for the resulting mask 800. Superimposed on the image are the outlines of the assist features 832 and 833 and the main apertures 831. Contours 834 indicate the edge of the resist pattern.

FIG. 9 shows a continuous-tone, continuous-phase mask designed according to a preferred embodiment. A continuous-tone, continuous-phase mask may not have any polygonal features. Such a mask can be implemented by continuously changing the thickness of an attenuating and/or phase-shifting film deposited on the photomask. In another embodiment, composition of films deposited on the photomask can be continuously changed. Either the thickness and/or composition of a deposited film can continuously varied as the film is deposited by a focused-ion beam. Using a focused-on beam enables addressing positions on the photomask with high-resolution. In another preferred embodiment, a continuous-tone, continuous-phase mask may be approximated by changing the density of very small, sub-resolution features. Target polygons 900 in FIG. 9 indicate the intended pattern on the wafer, which is not to be confused by the pattern on the mask. The figure-of-demerit comprises terms calculated at two defocus values: 0, and 80 nm. The real and imaginary parts of the mask function m(x, y) are depicted by gray-scale maps 910 (FIG. 9A) and 920 (FIG. 9B), respectively. Maps 930 (FIG. 9C) and 940 (FIG. 9D) show the amplitude and phase of the same mask function, respectively.

The continuous-amplitude, continuous-phase mask shown in FIG. 9 can be implemented in two ways. Lin at al. teaches in U.S. Pat. No. 4,902,899 a method of halftoning a photomask to achieve continuously varying phase and amplitude of the mask function. Continuously varying phase and amplitude is achieved by varying the density of sub-resolution (small) opaque, phase shifted and clear features. Presently, the size of the smallest feature that can be written on a photomask is half of the smallest feature of the target pattern. Therefore, halftone patterns that can be produced using present e-beam writers is coarse compared to the target pattern. This limitation is removed by producing photomasks by a focused ion beam (FIB) that are currently capable of making holes of 10 nm diameter in thin metallic films. May et al. in U.S. Pat. No. 6,130,012 disclose generating photomasks by ion beam milling. Focused ion beams can be used not only for milling but also selectively deposition opaque, attenuating, or phase shifting films.

Figure 10:
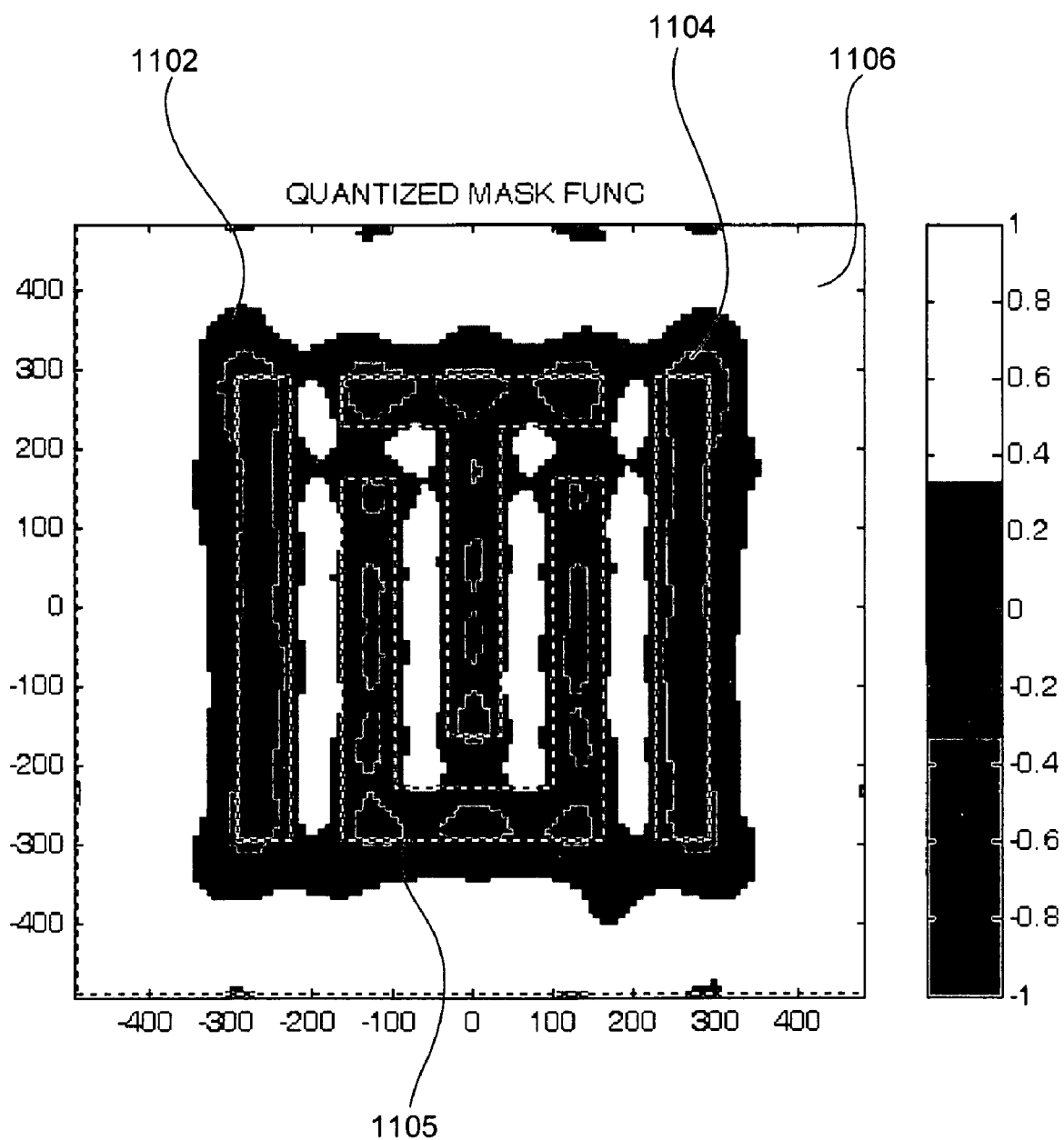
FIG. 10 illustrates a quantized approximation to the continuous-amplitude, continuous-phase photomask of FIG. 9.

In another embodiment, continuous-phase mask shown in FIG. 9 is quantized or discretized to values that are readily produced by the existing mask making technologies. In FIG. 10, the mask function shown in FIG. 9 is snapped to one of the values: −1, 0, and 1 which can be produced by phase-shift mask technology. Referring to FIG. 10, a region 1106 of the photomask where the mask function takes a value in a neighborhood of 1 is clear glass, a region 1102 of the photomask where the mask function takes a value in a neighborhood of zero is left covered with chrome, and a region 1104 of the photomask where the mask function takes a value in a neighborhood of −1 is etched to produce 180° phase-shifted apertures. The mask function shown in FIG. 10 can be further optimized to reduce a figure-of-demerit by moving the boundaries between the regions where the mask value assumes the values 1, 0, and −1.

In an alternative embodiment, the optimization process can be omitted. In this case, the assist features are placed according to the Fréchet derivative of the figure-of-demerit with respect to the mask function, and the edges of the polygons are moved to reduce the figure-of-demerit in a subsequent step.

Considering now the computer program product 70, in greater detail with reference to FIGS. 1 and 4, the computer program product 70 is a computer usable medium that has encoded thereon computer readable codes. The computer readable codes enable a user, via the CAD system 10, to implement a optical proximity correction and more specifically a method of photomask design that segments polygon edges optimally in a lithographic process. In this regard, the computer program product 70 has encoded thereon computer readable program code that causes the computer 30 in one preferred method 1021 to generate sub-resolution assist features and perform optical proximity correction in a single optimization process.

In another preferred method of making optical proximity corrections to a photomask data set, the computer program product 70 has encoded thereon computer readable program code 1021 that causes the computer 30 to provide an indication of how to change a photomask at any point on a mask design in order to approach specific design goals in a fast and effective manner.

In still yet another preferred method 1021 is a model-based method, which generates phase-shifted features.

Considering the preferred method 1021 in still yet greater detail, sub-resolution assist feature generation is valid for arbitrary two-dimensional patterns.

In still yet another preferred method 1021 of changing a mask function, the computer program product 70 has encoded thereon computer readable program code that causes the computer 30 to perform the steps of: 1) providing a method of calculating a figure-of-merit for any given mask function, the figure-of-merit measuring how well the mask function meets design goals; 2) calculating a map of the derivative of the figure-of-merit with respect to the mask function; and 3) altering phase and/or amplitude of the mask function according to the map calculated in step 2) to increase the figure-of-merit of the mask function. In the preferred embodiment, steps 2) and 3) are iteratively repeated.

In the last mentioned preferred method 1021, the step of assigning a figure-of-merit comprises providing a computational model of the patterning process, the computational model including at least one of the following effects: proximity effect and fogging in mask writing, mask etch, optical imaging, photoresist blur, photoresist develop, and wafer etch. The step of assigning a figure-of-merit further comprises calculating a measure of differences between a pattern predicted by the computational model and a target pattern, or providing a measure of differences between a pattern predicted by the computational model and a target pattern for more than one dose and/or defocus value or calculating a measure of image contrast or image slope.

Also in the last mentioned preferred method 1021, the step of altering the phase and/or amplitude of the mask function comprises modulating the density of opaque, or clear, or phase shifted features. In this regard, modulating the density of opaque, or clear, or phase shifted features further comprises using an ion beam to mill holes in an opaque film, or to mill phase-shifting apertures into a mask blank, or to deposit an opaque, attenuating or phase-shifting film on a photomask.

In still yet another preferred method 1021 of changing a photomask or mask-less lithography data set describing a mask function, the data set comprising polygons, the value of the mask function being substantially uniform in each polygon, the computer program product 70, has encoded thereon, computer readable program code that causes the computer 30 to perform the steps of: 1) providing a method of calculating a figure-of-merit for a given mask function, the figure-of-merit measuring how well the mask function and the corresponding photomask data set meet design goals; 2) moving edges of polygons in the photomask data set to optimize its figure-of-merit for a first set of process conditions; 3) calculating a map of the derivative of the figure-of-merit with respect to the mask function for a second set of process conditions; and 4) adding any combination of opaque, clear, attenuated, or phase shifted polygons to the photomask data set according to the map calculated in step 3). Also according to this method 1021, steps 2), 3) and 4) are iteratively repeated.

In an alternative embodiment, subresolution assist features or scattering bars are inserted into the mask layout at step 404 shown in the flowchart in FIG. 4A. The previously inserted subresolution assists features (SRAF) or scattering bars are adjusted in step 412. Adjusting a subresolution assist feature includes any combination of: translating, changing a dimension, deleting all or part of the subresolution assist feature. When the derivative of the figure-of-demerit with respect to the real part of the mask function is positive on part of an opaque, or attenuated-PSM, or a 180-degree aperture SRAF, that condition indicates the SRAF or part of the SRAF is counter-productive in meeting the design goals. Similarly, when the derivative of the figure-of-demerit with respect to the real part of the mask function is negative on part of a clear SRAF, that condition indicates the SRAF or part of the SRAF is counter-productive in meeting the design goals. In these cases, reducing a dimension, or deleting part of the SRAF will reduce the figure-of-demerit. In some cases, removing the entire SRAF may be beneficial, which can be tested by removing the SRAF and evaluating the figure-of-demerit of the resulting mask function.

In the preferred embodiment, the computer readable code has been described as being encoded on a disc 70 that can be entered into the computer memory 40 by the disc drive 22, which reads and transfers the code under computer control. However, it is contemplated that the code could be entered remotely from another computer, through a high speed cable or satellite connection, or directly from or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

It should be noted that during the optimization process 440, the edges of the polygons are moved to minimize the figure-of-demerit; the Fr&het derivative of the figure-of-demerit is recalculated; and the edges are further segmented according to the Frdchet derivative. For a detailed discussion of this process, refer to U.S. Patent Application Serial No. 11/203, 522, which is related to this application and which has been incorporated by reference. Alternatively, edges can be segmented based on predetermined rules.

I claim:

1. A method of improving image quality in a photolithographic process, comprising:
   calculating a derivative of a figure-of-demerit for a photolithographic mask function with respect to an aspect of the photolithographic mask function; and
   adjusting said photolithographic mask function to reduce said figure-of demerit using said calculation.

2. The method of improving image quality according to claim 1 further comprising:
repeating said steps of calculating and adjusting until said figure of demerit cannot be substantially reduced.

3. The method of improving image quality according to claim 1, further comprising repeating said steps of calculating and adjusting a predetermined number of times.

4. The method of improving image quality according to claim 1, wherein said derivative is a Frechet derivative of a functional of the photolithographic mask function.

5. The method of improving image quality according to claim 1, wherein calculating a map of a derivative of said figure-of-demerit is performed with respect to a real part of the photolithographic mask function.

6. The method of improving image quality according to claim 1, wherein calculating a map of a derivative of said figure-of-demerit is performed with respect to an imaginary part of the photolithographic mask function.

7. The method of improving image quality according to claim 1, wherein calculating a map of a derivative of said figure-of demerit is performed with respect to an amplitude of the photolithographic mask function.

8. The method of improving image quality according to claim 1, wherein calculating a map of a derivative of said figure-of-demerit is performed with respect to a phase of the photolithographic mask function.

9. The method of improving image quality according to claim 1, wherein said step of altering the value of the photolithographic mask function comprises: changing the transparency or reflectance of a region of the photomask.

10. The method of improving image quality according to claim 1, wherein said step of altering the value of the photolithographic mask function comprises: changing the thickness of a layer of the photomask.

11. The method of improving image quality according to claim 1, wherein said step of altering the value of the photolithographic mask function comprises: changing the phase shift the photomask imparts to the light projected from a region of the photomask.

12. The method of improving image quality according to claim 1, wherein said step of altering the value of the photolithographic mask function comprises: moving a boundary between two regions on the photomask; the two regions having distinct film stacks.

13. The method of improving image quality according to claim 1, wherein said step of altering the value of the photolithographic mask function comprises: placing a subresolution assist feature on the photomask.

14. The method of improving image quality according to claim 1, wherein said step of altering the value of the photolithographic mask function comprises: changing a dimension of a previously placed subresolution assist feature.

15. The method of improving image quality according to claim 1, wherein said step of altering the value of the photolithographic mask function comprises: translating a previously placed subresolution assist feature.

16. The method of improving image quality according to claim 1, wherein said step of altering the value of the photolithographic mask function comprises: deleting part or all of a previously placed subresolution assist feature.

17. The method of improving image quality according to claim 1, wherein said step of calculating a figure-of-demerit for a photolithographic mask function includes using a computational model of a patterning process which substantially predicts at least one of the following: a mask writing proximity effect; a fogging effect in mask writing; a mask etch effect; an optical imaging effect; a photoresist blur effect; a photoresist develop effect; and a wafer etch effect.

18. The method of improving image quality according to claim 17, wherein said step of calculating a figure-of-demerit includes: calculating a measure of difference between a pattern predicted by said computational model and a desired target pattern.

19. The method of improving image quality according to claim 18, wherein said step of calculating a measure of difference between a pattern predicted by said computational model and a desired target pattern is performed for more than one exposure dose.

20. The method of improving image quality according to claim 18, wherein said step of calculating a measure of difference between a pattern predicted by said computational model and a desired target pattern is performed for more than one defocus value.

21. The method of improving image quality according to claim 18, wherein said step of calculating a measure of difference between a pattern predicted by said computational model and a desired target pattern is performed for more than one exposure dose and more than one defocus value.

22. The method of improving image quality according to claim 18, wherein said step of calculating comprises evaluating differences between said predicted pattern and said target pattern at a plurality of target points.

23. The method of improving image quality according to claim 22, wherein said step of calculating further comprises summing squares of said differences.

24. The method of improving image quality according to claim 22, wherein said step of calculating further comprises summing absolute values of said differences.

25. The method of improving image quality according to claim 22, wherein said step of calculating further comprises finding the greatest absolute value of said differences.

26. The method of improving image quality according to claim 17, wherein said step of determining a figure-of demerit includes: calculating a measure of image slope.

27. The method of improving image quality according to claim 17, wherein said step of determining a figure-of-merit includes: calculating a measure of image contrast.

28. The method of improving image quality according to claim 17, wherein said step of determining a figure-of demerit includes: calculating a difference in the pattern predicted by said computational model; wherein the difference is in response to a change in the exposure dose.

29. The method of improving image quality according to claim 17, wherein said step of determining a figure-of demerit includes: calculating a difference in the pattern predicted by said computational model; wherein the difference is in response to a change in the defocus.

30. The method of improving image quality according to claim 17, wherein said step of determining a figure-of-demerit includes a combination of two or more of the following:
calculating a measure of difference between a pattern predicted by said computational model and a desired target pattern;
calculating a difference in the pattern predicted by said computational model wherein the difference is in response to a change in the exposure dose; and
calculating a difference in the pattern predicted by said computational model wherein the difference is in response to a change in the defocus.

31. The method of improving image quality according to claim 17, wherein said figure-of-demerit is continuously differentiable with respect to an image calculated by said computational model.

32. The method of improving image quality according to claim 31, wherein said figure-of-demerit quadratically depends on an image intensity calculated by said computational model.

33. The method of improving image quality according to claim 31, wherein said figure-of-demerit is a rational polynomial of image intensities calculated by said computational model.

34. The method of improving image quality according to claim 1, wherein said figure-of-demerit is continuously differentiable with respect to the value of the photolithographic mask function in a region of the photomask.

35. The method of improving image quality according to claim 1, wherein said step of altering further comprises generating sub-resolution assist features and performing optical proximity correction in a single optimization process.

36. A method of generating assist features comprising:
selecting a mask function defined by a set of layout polygons, wherein each individual layout polygon has a set of edges;
assigning a figure-of-demerit to said mask function;
moving individual edges of said set of polygons to reduce the figure-of-demerit;
after said step of moving, designating a neighborhood for each individual edge of each individual layout polygon as an assist-feature exclusion zone; and
placing an assist feature outside all designated neighborhoods according to a derivative of the figure-of-demerit with respect to the mask function.

37. The method of generating assist features according to claim 36 further comprising:
designating a neighborhood for the assist feature placed during said step of placing as another assist-feature exclusion zone; and
repeating the last two-mentioned steps of placing and designating until all the neighborhoods are excluded.

38. The method of generating assist features according to claim 36, wherein said step of placing includes: placing an opaque assist feature where the derivative of the figure-of-demerit with respect to a real part of the mask function is positive.

39. The method of generating assist features according to claim 36, wherein said step of placing includes: placing a 180 degree phase shifted assist feature where the derivative of the figure-of-demerit with respect to a real part of the mask function is positive.

40. The method of generating assist features according to claim 36, wherein said step of placing includes: placing an attenuated, phase-shifted assist feature where the derivative of the figure-of-demerit with respect to a real part of the mask function is positive.

41. The method of generating assist features according to claim 36, wherein said step of placing includes: placing a clear assist feature centered where the derivative of the figure-of-demerit with respect to a real part of the mask function is negative.

42. The method of generating assist features according to claim 36, wherein said step of placing includes: placing a −90° phase shifted assist feature where the derivative of the figure-of demerit with respect to an imaginary part of the mask function is positive.

43. The method of generating assist features according to claim 36, wherein said step of placing includes: placing a +90° phase shifted assist feature where the derivative of the figure-of-demerit with respect to an imaginary part of the mask function is negative.

44. The method of generating assist features according to claim 36, further comprising: repeating said steps of moving, designating, placing, until a design goal is met.

45. The method of generating assist features according to claim 36, further comprising: repeating said steps of moving, designating, placing, a predetermined number of times.

46. A method of adjusting subresolution assist features included in a set of layout polygons indicative of a mask function, the method comprising:
assigning a figure-of-demerit to said mask function;
calculating a derivative of the figure-of-demerit with respect to the mask function; and
adjusting a subresolution assist feature according to said derivative.

47. The method of adjusting subresolution assist features according to claim 46 wherein the step of adjusting comprises: deleting an opaque assist feature on which said derivative is negative.

48. The method of adjusting subresolution assist features according to claim 46 wherein the step of adjusting comprises: reducing a dimension of an opaque assist feature on which said derivative is negative.

49. The method of adjusting subresolution assist features according to claim 46 wherein the step of adjusting comprises: translating an opaque assist feature to a region where said derivative is larger than it is in the opaque assist feature.

50. The method of adjusting subresolution assist features according to claim 46 wherein the step of adjusting comprises: deleting an 180° phase shifted assist feature on which said derivative is negative.

51. The method of adjusting subresolution assist features according to claim 46 wherein the step of adjusting comprises: reducing a dimension of a 180° phase shifted assist feature on which said derivative is negative.

52. The method of adjusting subresolution assist features according to claim 46 wherein the step of adjusting comprises: translating a 180° phase shifted assist feature to a region where said derivative is larger than it is in the assist feature.

53. The method of adjusting subresolution assist features according to claim 46 wherein the step of adjusting comprises: deleting a clear assist feature on which said derivative is positive.

54. The method of adjusting subresolution assist features according to claim 46 wherein the step of adjusting comprises: reducing a dimension of a clear assist feature on which said derivative is positive.

55. The method of adjusting subresolution assist features according to claim 46 further comprising: translating a clear assist feature to a region where said derivative is smaller than it is in the clear assist feature.

* * * * *